(12) United States Patent
Jung et al.

(10) Patent No.: US 11,811,364 B2
(45) Date of Patent: Nov. 7, 2023

(54) CLOCK INTEGRATED CIRCUIT INCLUDING HETEROGENEOUS OSCILLATORS AND APPARATUS INCLUDING THE CLOCK INTEGRATED CIRCUIT

(71) Applicant: SAMSUNG ELECTRONICS CO., LTD., Suwon-si (KR)

(72) Inventors: Jaehong Jung, Bucheon-si (KR); Seunghyun Oh, Seoul (KR); Jinhyeon Lee, Hwaseong-si (KR); Gihyeok Ha, Seoul (KR); Seungjin Kim, Yongin-si (KR); Joomyoung Kim, Hwaseong-si (KR); Yelim Youn, Hwaseong-si (KR); Jaehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/845,378

(22) Filed: Jun. 21, 2022

(65) Prior Publication Data
US 2022/0407459 A1 Dec. 22, 2022

(30) Foreign Application Priority Data

Jun. 22, 2021 (KR) .................. 10-2021-0081039
Sep. 24, 2021 (KR) .................. 10-2021-0126725

(51) Int. Cl.
*H03B 5/32* (2006.01)
*G06F 1/06* (2006.01)
(Continued)

(52) U.S. Cl.
CPC ............. *H03B 5/32* (2013.01); *G06F 1/06* (2013.01); *H03B 5/04* (2013.01); *H03B 5/20* (2013.01); *H03B 2200/0082* (2013.01)

(58) Field of Classification Search
CPC ........................................ H03B 5/32
(Continued)

(56) References Cited

U.S. PATENT DOCUMENTS 6,006,165 A * 12/1999 Okada .................. G01P 3/68
702/96
7,612,624 B2 * 11/2009 Lim ...................... H03L 7/06
331/34
(Continued)

FOREIGN PATENT DOCUMENTS

| CN | 109067394 A | 12/2018 |
|---|---|---|
| JP | 2013-167597 A | 8/2013 |
| JP | 2017-10297 A | 1/2017 |

OTHER PUBLICATIONS

Jongsoo Lee et al., "NB-IoT and GNSS All-In-One System-On-Chip Integrating RF Transceiver, 23-dBm CMOS Power Amplifier, Power Management Unit, and Clock Management System for Low Cost Solution," IEEE Journal of Solid-State Circuits vol. 55 No. 12, Dec. 2020, (14 total pages).

(Continued)

*Primary Examiner* — Joseph Chang
(74) *Attorney, Agent, or Firm* — Sughrue Mion, PLLC

(57) ABSTRACT

A clock integrated circuit is provided. The clock integrated circuit includes: a first clock generator which includes a crystal oscillator configured to generate a first clock signal; and a second clock generator which includes a resistance-capacitance (RC) oscillator and a first frequency divider, and is configured to: generate a second clock signal using the first frequency divider based on a clock signal output from the RC oscillator; perform a first calibration operation for adjusting a frequency division ratio of the first frequency divider to a first frequency division ratio based on the first clock signal; and perform a second calibration operation for (Continued)

adjusting the first frequency division ratio to a second frequency division ratio based on a sensed temperature.

20 Claims, 17 Drawing Sheets

(51) Int. Cl.
  *H03B 5/04* (2006.01)
  *H03B 5/20* (2006.01)
(58) Field of Classification Search
  USPC .......................................................... 331/156
  See application file for complete search history.

(56) References Cited

U.S. PATENT DOCUMENTS

| | | |
|---|---|---|
| 9,755,575 B1 | 9/2017 | Wang et al. |
| 9,817,432 B2 | 11/2017 | Miyasaka |
| 10,097,283 B1 | 10/2018 | Yeager et al. |
| 2006/0056561 A1 | 3/2006 | Zhang |
| 2006/0181358 A1* | 8/2006 | Kitagawa .................. H03L 1/00 331/135 |

OTHER PUBLICATIONS

European Search Report, dated Dec. 1, 2022, issued by the European Patent Office, in App No. 22180530.2.

* cited by examiner

CLOCK INTEGRATED CIRCUIT INCLUDING HETEROGENEOUS OSCILLATORS AND APPARATUS INCLUDING THE CLOCK INTEGRATED CIRCUIT

CROSS-REFERENCE TO RELATED APPLICATIONS

This application is based on and claims priority to Korean Patent Application Nos. 10-2021-0081039, filed on Jun. 22, 2021, and 10-2021-0126725, filed on Sep. 24, 2021, in the Korean Intellectual Property Office, the disclosures of which are incorporated by reference herein in their entireties.

BACKGROUND

The present disclosure relates to a clock integrated circuit, and more particularly, to a clock integrated circuit including heterogeneous oscillators and an apparatus including the clock integrated circuit.

A clock integrated circuit may provide a clock signal of a high frequency band as a main clock signal and a clock signal of a low frequency band as a sub clock signal to various intellectual properties (IPs). The main clock signal may be used to perform a unique processing operation of IPs, and the sub clock signal may be a real time clock signal and may be used for a time measurement of IPs, a system on/off operation, and the like. A clock integrated circuit may include both a crystal oscillator for generating a clock signal of a high frequency band and a crystal oscillator for generating a clock signal of a low frequency band. The crystal oscillator generates a clock signal with good characteristics against noise, but is not suitable for designing a semiconductor chip pursuing light weight and low power because the crystal oscillator has a large design area and high power consumption.

SUMMARY

One or more example embodiments provide a clock integrated circuit for generating accurate clock signals while reducing the number of crystal oscillators, and an apparatus including the clock integrated circuit.

According to an aspect of an example embodiment, a clock integrated circuit includes: a first clock generator which includes a crystal oscillator and is configured to use the crystal oscillator to generate a first clock signal; and a second clock generator which includes a resistance-capacitance (RC) oscillator and a first frequency divider, and is configured to: generate a second clock signal using the first frequency divider based on a clock signal output from the RC oscillator; perform a first calibration operation for adjusting a frequency division ratio of the first frequency divider to a first frequency division ratio based on the first clock signal; and perform a second calibration operation for adjusting the first frequency division ratio to a second frequency division ratio based on a sensed temperature.

According to an aspect of an example embodiment, an apparatus includes: a first clock generator configured to generate a first clock signal having a first frequency using a first oscillator; and a second clock generator configured to: generate a second clock signal having a second frequency by dividing a clock signal output from a second oscillator; and control the second frequency to a target frequency by controlling a frequency division ratio of the second clock generator based on the first clock signal and a sensed temperature.

According to an aspect of an example embodiment, a clock integrated circuit includes: a crystal oscillator; a gain control circuit configured to output a clock signal generated by the crystal oscillator as a first clock signal; an RC oscillator; a frequency division circuit configured to divide a clock signal generated by the RC oscillator and output the divided clock signal as a second clock signal; and a calibration circuit configured to control the second clock signal to have a target frequency by adjusting a frequency division ratio of the frequency division circuit based on the first clock signal. The first clock signal is output to an electronic circuit as a main clock signal of a first frequency band, and the second clock signal is output to the electronic circuit as a real-time clock signal of a second frequency band that is lower than the first frequency band.

BRIEF DESCRIPTION OF THE DRAWINGS

The above and other aspects will be more clearly understood from the following description of example embodiments taken in conjunction with the accompanying drawings, in which.

DETAILED DESCRIPTION

Hereinafter, example embodiments will be described in detail with reference to the accompanying drawings. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
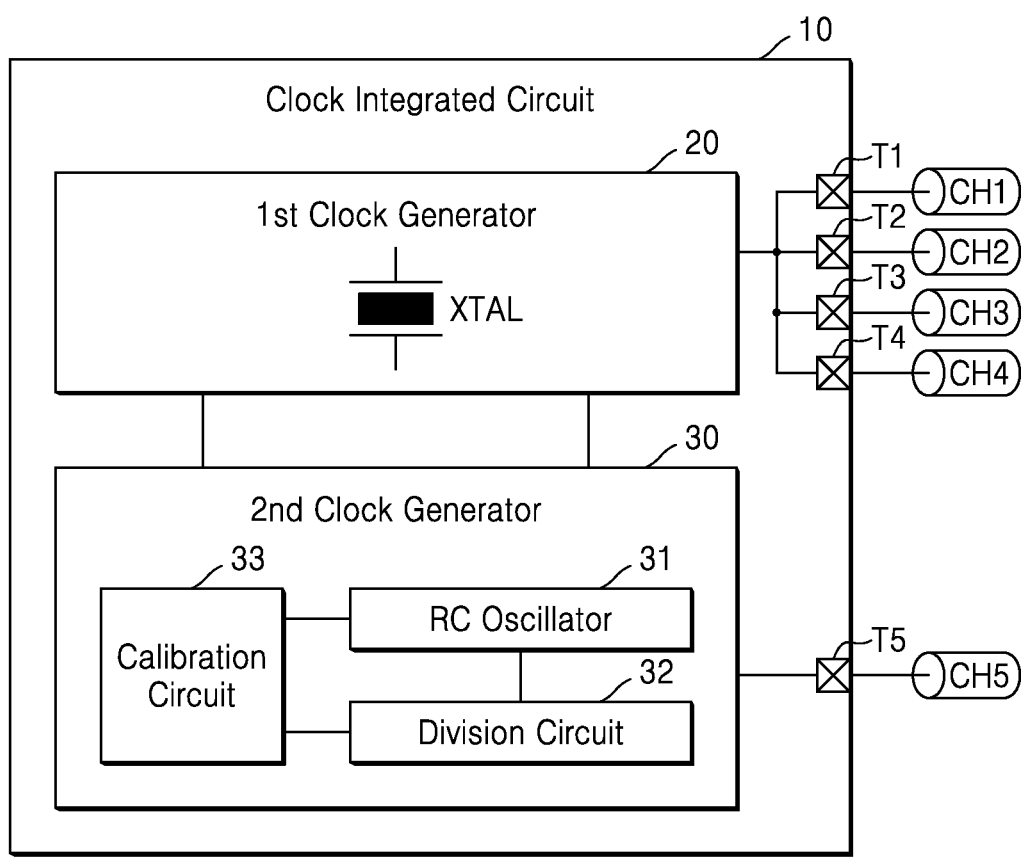
FIG. 1 is a schematic block diagram of a clock integrated circuit according to an example embodiment.

FIG. 1 is a schematic block diagram of a clock integrated circuit 10 according to an example embodiment. A clock integrated circuit may indicate a circuit that includes heterogeneous oscillators and provides clock signals of various frequency bands to other chips or electronic circuits. In addition, although the clock integrated circuit is described herein as a configuration including a plurality of clock generators, this is only an example embodiment, and the plurality of clock generators may be implemented to be included in different integrated circuits or different chips.

Referring to FIG. 1, the clock integrated circuit 10 may include a first clock generator 20, a second clock generator 30, and first to fifth terminals T1 to T5.

In an example embodiment, the first clock generator 20 may include a crystal oscillator XTAL. The crystal oscillator XTAL may resonate a crystal included therein, thereby outputting a clock signal corresponding to the natural frequency of the crystal. The clock signal output from the crystal oscillator XTAL may be referred to as a frequency signal. The clock integrated circuit 10 may also be referred to as a single crystal oscillator-based clock integrated circuit. The first clock generator 20 may generate a first clock signal by using the crystal oscillator XTAL. The first clock signal may indicate a clock signal generated by the first clock generator 20, and the frequency of the first clock signal may be the same as or similar to the frequency of the clock signal of the crystal oscillator XTAL. The first clock generator 20 may output a first clock signal from the first to fourth terminals T1 to T4 and provide the first clock signal to a plurality of chips or a plurality of electronic circuits through first to fourth channels CH1 to CH4. In an example embodiment, the first clock signal is a signal of a high frequency band and may be used to generate a main clock signal for at least one of a data processing operation and a data communication operation. For example, the data processing operation may be an operation performed by an intellectual property (IP). For example, an IP may include circuitry to perform specific functions, and may have a design that includes a trade secret. For example, an IP may indicate a central processing unit (CPU), a graphics processing unit (GPU), a baseband processor (BP), or an application processor (AP).

In an example embodiment, the first clock generator 20 may provide the first clock signal to the second clock generator 30. The second clock generator 30 may generate a second clock signal having a target frequency by using the first clock signal, as described below. The second clock signal may indicate a clock signal generated by the second clock generator 30. Because the first clock signal is generated from the clock signal of the crystal oscillator XTAL and has good signal characteristics, the first clock signal may be used as a reference signal for allowing the second clock signal to have a target frequency. Detailed descriptions thereof are provided below.

In an example embodiment, the second clock generator 30 may include a resistance-capacitance (RC) oscillator 31, a division circuit 32, and a calibration circuit 33. The RC oscillator 31 may include an RC network including at least one resistor and at least one capacitor. The RC oscillator 31 may output a clock signal of a lower frequency band, compared to the crystal oscillator XTAL. In the present specification, example embodiments of the clock integrated circuit 10 are described focusing on an implementation example including the crystal oscillator XTAL and the RC oscillator 31. However, example embodiments are not limited thereto, and the clock integrated circuit 10 may include various heterogeneous oscillators. The second clock generator 30 may output the second clock signal from the fifth terminal T5 and provide the second clock signal to at least one chip or at least one electronic circuit through a fifth channel CH5. In an example embodiment, the second clock signal is a signal of a low frequency band and may correspond to a real time clock signal for at least one of a time measurement and a system on/off operation. For example, the second clock signal may be of a lower frequency band than the first clock signal. For example, the time measurement may include an operation of counting time in a certain timer, and the system on/off operation may include a power on/power off operation of a chip or electronic circuit. The division circuit 32 may generate a second clock signal by dividing the clock signal output from the RC oscillator 31. In an example embodiment, the frequency division ratio (hereinafter, referred to as 'division ratio') of the division circuit 32 may be controlled by the calibration circuit 33. In some example embodiments, the division circuit 32 may include a plurality of frequency dividers (hereinafter, referred to as 'dividers'), and in this case, the division ratio of the division circuit 32 may include a division ratio of at least one divider controlled by the calibration circuit 33 from among the plurality of dividers. A detailed implementation example of the division circuit 32 is described below.

In an example embodiment, the calibration circuit 33 may perform a first calibration operation of adjusting the division ratio of the division circuit 32 to a first division ratio by using the first clock signal, and may perform a second calibration operation of adjusting the first division ratio to a second division ratio by using a sensed temperature in the clock integrated circuit 10 or an apparatus including the clock integrated circuit 10. In an example embodiment, the calibration circuit 33 may primarily adjust the division ratio of the division circuit 32 to correct the center frequency of the second clock signal by using the first clock signal, and may secondarily adjust the division ratio of the division circuit 32 based on a gain according to a temperature with respect to the second clock signal by using the sensed temperature. The calibration circuit 33 may control the second clock signal to have a target frequency through at least one of the first calibration operation and the second calibration operation. Detailed examples of the first and second calibration operations are described below.

In an example embodiment, the calibration circuit 33 may selectively perform the first and second calibration operations based on at least one of an operation mode and a calibration condition. The operation mode may refer to an operation mode of the clock integrated circuit 10, and may include an active mode, a calibration mode, and an off mode. However, this is only an example embodiment, and the present disclosure is not limited thereto. For example, the operation mode may include additional and/or different modes.

In an example embodiment, the active mode may be an operation mode in which the first clock generator 20 and the second clock generator 30 are activated to output the first clock signal and the second clock signal through the first to fifth terminals T1 to T5. The calibration mode may be an operation mode in which the first clock generator 20 is selectively activated to provide the first clock signal to the calibration circuit 33, and the second clock generator 30 is activated to output the second clock signal through the fifth terminal T5. The off mode may be an operation mode in which the first clock generator 20 is deactivated and the second clock generator 30 is activated to output the second clock signal through the fifth terminal T5. In the off mode, the second clock generator 30 may output a second clock signal having excellent frequency stability by using a division ratio adjusted and learned in the active mode or the calibration mode.

In an example embodiment, the calibration circuit 33 may perform the first and second calibration operations when a calibration condition is satisfied in the active mode or the calibration mode. In an example embodiment, the calibration condition may relate to at least one of whether a certain timer has expired and whether a change of the sensed temperature exceeds a threshold. Specifically, the calibration circuit 33 may monitor whether a calibration condition is satisfied in the active mode or the calibration mode, and may perform the first and second calibration operations whenever the calibration condition is satisfied. When the first and second calibration operations are completed, the calibration circuit 33 may reset the certain timer or may use a sensed temperature in the completed second calibration operation as a reference temperature for determining whether a next calibration condition is satisfied. For example, the reference temperature may be used to identify a new threshold for the next calibration condition. The calibration circuit 33 may monitor whether the next calibration condition is satisfied in the active mode or the calibration mode, and may perform the first and second calibration operations whenever the next calibration condition is satisfied.

In an example embodiment, the calibration circuit 33 may perform only the second calibration operation when a calibration condition is not satisfied in the active mode or the calibration mode. Specifically, the calibration circuit 33 may continuously sense a temperature in the clock integrated circuit 10 or the apparatus including the clock integrated circuit 10 and continuously perform the second calibration operation based on the sensed temperature.

In an example embodiment, the calibration circuit 33 may receive the first clock signal from the first clock generator 20 by activating the first clock generator 20 in a partial period when a calibration condition is satisfied in the calibration mode. The calibration circuit 33 may perform the first calibration operation described above by using the first clock signal.

In an example embodiment, the calibration circuit 33 may perform only the second calibration operation in the off mode regardless of whether a calibration condition is satisfied. Specifically, the calibration circuit 33 may continuously sense a temperature in the clock integrated circuit 10 or the apparatus including the clock integrated circuit 10 and continuously perform the second calibration operation based on the sensed temperature.

In an example embodiment, the second calibration operation performed in the active mode or the calibration mode may be slightly different from the second calibration operation performed in the off mode. Specifically, the second calibration operation performed in the active mode or the calibration mode may further include an operation of adjusting a temperature compensation gain, which is described below, and may be based on an adjusted temperature compensation gain, and the second calibration operation performed in the off mode may be based on a fixed temperature compensation gain. Detailed descriptions thereof are provided below.

The clock integrated circuit 10 according to an example embodiment does not further include an additional crystal oscillator to generate a second clock signal (or a real-time clock signal) for a time measurement and a system on/off operation, but includes an RC oscillator having a relatively small area, thereby improving the degree of integration of the clock integrated circuit 10. The clock integrated circuit 10 according to an example embodiment may improve the accuracy of the second clock signal (or the real-time clock signal) through a calibration operation using the clock signal of the crystal oscillator XTAL and the sensed temperature. In addition, the clock integrated circuit 10 according to an example embodiment may reduce power consumption by activating, only in a partial period, the first clock generator 20 generates the first clock signal required for a calibration operation with respect to the second clock signal in the calibration mode.

An example embodiment in which the clock integrated circuit 10 includes the crystal oscillator XTAL and the RC oscillator 31 has been mainly described with reference to FIG. 1. However, example embodiments are not limited thereto. For example, the first clock generator 20 and the second clock generator 30 may include a first-type oscillator and a second-type oscillator, respectively.

Figure 2A:
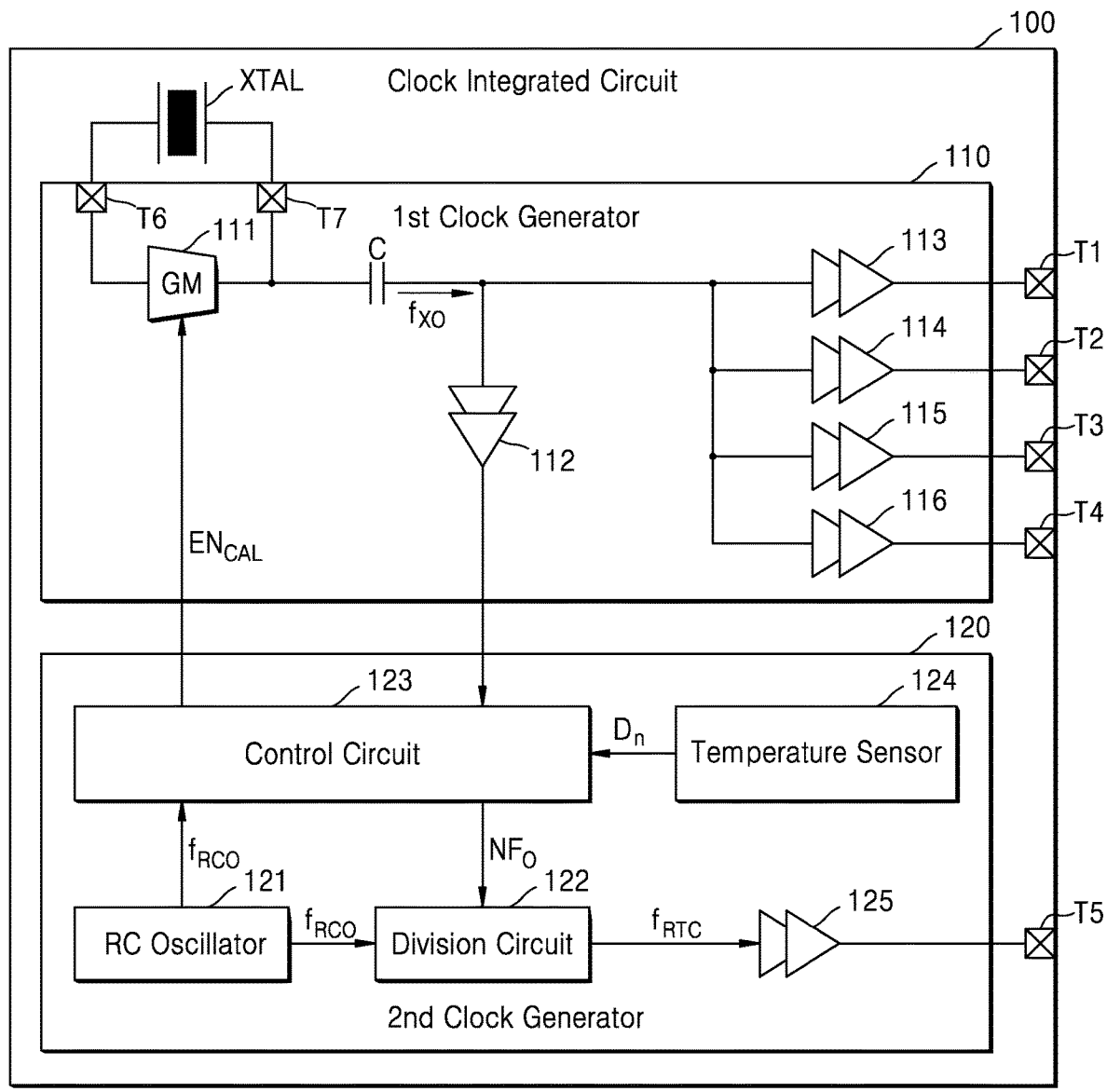
FIGS. 2A and 2B are block diagrams of clock integrated circuits according to example embodiments.
Figure 2B:
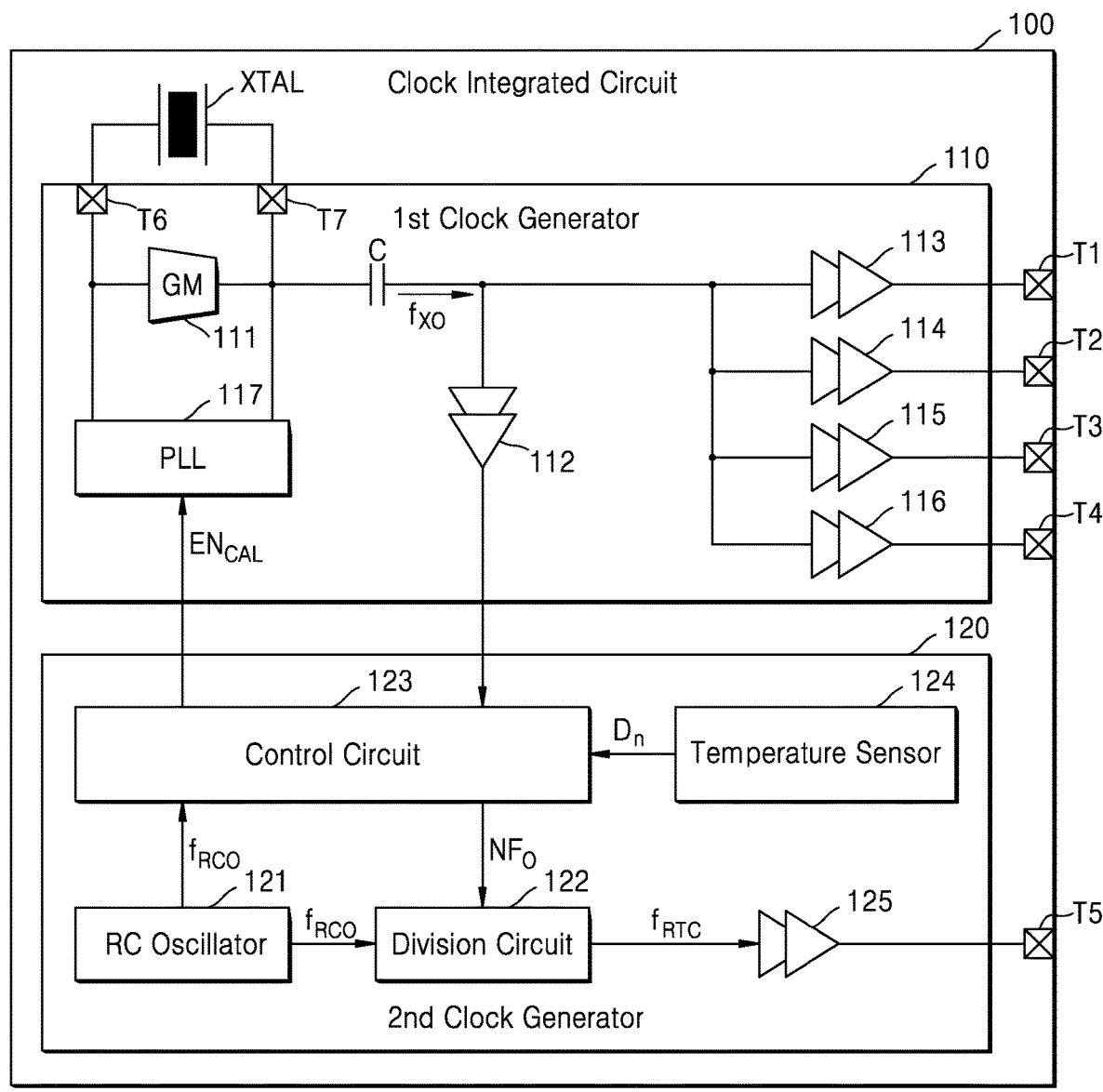

FIGS. 2A and 2B are block diagrams of clock integrated circuits 100 and 100' according to example embodiments.

Referring to FIG. 2A, the clock integrated circuit 100 may include a first clock generator 110, a second clock generator 120, and first to fifth terminals T1 to T5.

In an example embodiment, the first clock generator 110 may include a crystal oscillator XTAL, a gain control circuit 111, a capacitor C, first to fifth buffer circuits 112 to 116, and sixth and seventh terminals T6 and T7. As shown in FIG. 2A, the crystal oscillator XTAL may be arranged outside the first clock generator 110 and coupled to the first clock generator 110 through the sixth and seventh terminals T6 and T7. In some example embodiments, the crystal oscillator XTAL may be arranged inside the first clock generator 110. The gain control circuit 111 may generate a first clock signal $f_{XO}$ from (i.e., based on) a clock signal of the crystal oscillator XTAL. For example, the gain control circuit 111 may amplify a clock signal output from the crystal oscillator XTAL, based on a controllable gain. In some example embodiments, the gain control circuit 111 may be referred to as a transconductance circuit. Activation/deactivation of the gain control circuit 111 may be controlled according to an enable signal $EN_{CAL}$, which is described below.

Referring to FIG. 2B, a first clock generator 110' of the clock integrated circuit 100' may further include a phase locked loop (PLL) circuit 117 to shorten an oscillation time of the crystal oscillator XTAL. The PLL circuit 117 may output a signal having a fixed phase corresponding to the phase of the clock signal output from the crystal oscillator XTAL. In this case, the enable signal $EN_{CAL}$, which is described below, may be provided to the PLL circuit 117.

Returning back to FIG. 2A, the first clock signal $f_{XO}$ may pass through the capacitor C, which may remove signal components in unwanted frequency bands. The first clock signal $f_{XO}$ may pass through each of the first to fifth buffer circuits 112 to 116. Each of the first to fifth buffer circuits 112 to 116 is a circuit for buffering an input and may include elements for amplifying the input or for a timing delay. The first clock signal $f_{XO}$ passing through the first buffer circuit 112 may be provided to a control circuit 123 of the second clock generator 120, which will be described below, and the first clock signal $f_{XO}$ passing through the second to fifth buffer circuits 113 to 116 may be output to the outside through the first to fourth terminals T1 to T4. In an example embodiment, activation/deactivation of the first to fifth buffer circuits 112 to 116 may be independently controlled so that the first clock signal $f_{XO}$ may be selectively provided to a necessary circuit or device. In some example embodiments, activation/deactivation of the first to fifth buffer circuits 112 to 116 may be collectively controlled.

In an example embodiment, the second clock generator 120 may include an RC oscillator 121, a division circuit 122, a control circuit 123, a temperature sensor 124, and a sixth buffer circuit 125. The RC oscillator 121 may output a clock signal $f_{RCO}$ to the division circuit 122 and the control circuit 123. For example, the frequency of the clock signal $f_{RCO}$ of the RC oscillator 121 may be lower than the frequency of the clock signal $f_{XO}$ of the crystal oscillator XTAL, and the RC oscillator 121 may have a smaller design area than the crystal oscillator XTAL and thus may be advantageous for miniaturization of the clock integrated circuit 100. However, because the clock signal $f_{RCO}$ of the RC oscillator 121 may have weaker characteristics in noise, temperature, jitter, etc., than the clock signal $f_{XO}$ of the crystal oscillator XTAL, the frequency of the clock signal $f_{RCO}$ may be somewhat unstable. A calibration operation may be performed to compensate for the above characteristics of the clock signal $f_{RCO}$ of the RC oscillator 121. The calibration circuit 33 of FIG. 1 may include a control circuit 123 and a temperature sensor 124.

In an example embodiment, the temperature sensor 124 may sense an internal temperature of the clock integrated circuit 100 or an apparatus including the clock integrated circuit 100. In FIGS. 2A and 2B, the second clock generator 120 is illustrated as including the temperature sensor 124. However, this is only an example embodiment, and the present disclosure is not limited thereto. For example, the temperature sensor 124 may be arranged at a position where the temperature sensor 124 is capable of accurately sensing an internal temperature of the clock integrated circuit 100 or an apparatus including the clock integrated circuit 100. The internal temperature of an integrated circuit or apparatus may indicate an average internal temperature of the integrated circuit or apparatus, a temperature of a position where the internal temperature is sensitively changed within the integrated circuit or apparatus, or the like. The temperature sensor 124 may provide a sensed temperature $D_n$ generated by sensing a temperature at a constant cycle to the control circuit 123. The sensed temperature $D_n$ may be used in a calibration operation for compensating for a frequency drift phenomenon of the clock signal $f_{RCO}$ of the RC oscillator 121 according to the temperature, as described below.

In an example embodiment, the control circuit 123 may receive the first clock signal $f_{XO}$, the clock signal $f_{RCO}$ of the RC oscillator 121, and the sensed temperature $D_n$. The control circuit 123 may generate a division ratio $NF_O$ for the clock signal $f_{RCO}$ of the RC oscillator 121, based on the first clock signal $f_{XO}$, the clock signal $f_{RCO}$, and the sensed temperature $D_n$. The control circuit 123 may output the division ratio $NF_O$ to the division circuit 122. In some example embodiments, the division ratio $NF_O$ may be referred to as a variable division ratio. An operation of controlling a division ratio may indicate an operation of adjusting the division ratio, and the operation of controlling a division ratio may indicate a calibration operation with respect to the division ratio. In an example embodiment, the division circuit 122 may generate a second clock signal $f_{RTC}$ by dividing the clock signal $f_{RCO}$ of the RC oscillator 121 based on the controlled division ratio $NF_O$. In an example embodiment, the second clock signal $f_{RTC}$ output from the division circuit 122 may pass through the sixth buffer circuit 125 and be output to the outside through the fifth terminal T5. The second clock signal $f_{RTC}$ may have a target frequency through a calibration operation of the control circuit 123. In the present specification, that the second clock signal $f_{RTC}$ has a target frequency may mean having a frequency equal to or similar to the target frequency. As an example, the target frequency may be 32.768 kHz.

In an example embodiment, the control circuit 123 may check the state of the clock signal $f_{RCO}$ of the RC oscillator 121, based on the first clock signal $f_{XO}$, and may adjust the division ratio $NF_O$ to a first division ratio, based on a result of the checking, and adjust the first division ratio to a second division ratio by performing temperature compensation on the first division ratio, based on the sensed temperature $D_n$.

In an example embodiment, the control circuit 123 may perform an adjustment operation for a temperature compensation gain in the first calibration operation and the second calibration operation among the calibration operations for the division ratio $NF_O$ only when a calibration condition is satisfied in a certain operation mode. Also, the control circuit 123 may continuously perform, regardless of the operation mode and the calibration condition, the remaining second calibration operation excluding the adjustment operation for the temperature compensation gain from among the calibration operations for the division ratio $NF_O$. In some example embodiments, the remaining second calibration operation excluding the adjustment operation for the temperature compensation gain may be referred to as a background calibration operation. The calibration condition may be set as conditions that may predict a change in the frequency of the clock signal $f_{RCO}$ of the RC oscillator 121 to the extent that control of the division ratio $NF_O$ is required. In an example embodiment, the calibration condition may be set to at least one of whether a certain timer has expired and whether a change in the sensed temperature $D_n$ exceeds a threshold. That is, a change in the frequency of the clock signal $f_{RCO}$ of the RC oscillator 121 over a certain time and a change in the frequency of the clock signal $f_{RCO}$ of the RC oscillator 121 according to a change in the sensed temperature $D_n$ exceeding a threshold may cause a frequency change that exceeds an allowable range of the second clock signal $f_{RTC}$, and accordingly, one or more of the above conditions may be set as the calibration condition. As the control circuit 123 controls the division ratio $NF_O$ through calibration operations, the second clock generator 120 may output the second clock signal $f_{RTC}$ controlled to have a target frequency.

In an example embodiment, the control circuit 123 may provide an enable signal $EN_{CAL}$ having a certain level to the gain control circuit 111 to control the first clock generator 110 to provide the first clock signal $f_{XO}$ required for a calibration operation in the active mode or the calibration mode. In some example embodiments, the enable signal $EN_{CAL}$ may also be provided to the first buffer circuit 112. The enable signal $EN_{CAL}$ may be a signal having a low level or a high level, and the gain control circuit 111 (or the first clock generator 110) may provide the first clock signal $f_{XO}$ to the control circuit 123 according to a high level of the enable signal $EN_{CAL}$, and may not provide the first clock signal $f_{XO}$ to the control circuit 123 according to a low level of the enable signal $EN_{CAL}$. It will be fully understood that this is an example, and example embodiments are not limited thereto.

Figure 3:
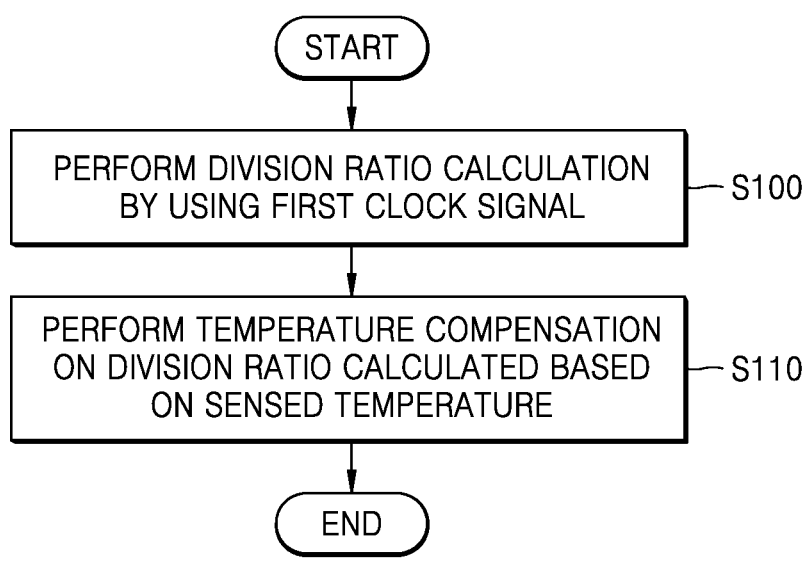
FIG. 3 is a flowchart illustrating an operation method of a control circuit in FIGS. 2A and 2B, according to an example embodiment.

FIG. 3 is a flowchart illustrating an operation method of the control circuit 123 in FIGS. 2A and 2B, according to an example embodiment. In FIG. 3, a calibration operation of the control circuit 123 in FIGS. 2A and 2B is illustrated. Operation S100 may be referred to as a first calibration operation and operation S110 may be referred to as a second calibration operation. Hereinafter, it will be described with further reference to FIGS. 2A and 2B for better understanding.

Referring to FIGS. 2A and 2B and FIG. 3, in operation S100, the control circuit 123 may calculate a division ratio $NF_O$ by using the first clock signal $f_{XO}$. In an example embodiment, the control circuit 123 may check a frequency change degree of the clock signal $f_{RCO}$ of the RC oscillator 121, based on the first clock signal $f_{XO}$, and may calculate a division ratio $NF_O$ corresponding to the frequency change degree. Operation S100 may be selectively performed based on an operation mode and a calibration condition of the clock integrated circuit 100. In operation S110, the control circuit 123 may perform temperature compensation on a division ratio $NF_O$ calculated based on the sensed temperature $D_n$. In an example embodiment, the control circuit 123 may additionally adjust the calculated division ratio $NF_O$ according to the sensed temperature $D_n$. Operation S110 may further include an operation of adjusting a temperature compensation gain for temperature compensation. Specifically, the control circuit 123 may selectively perform the operation of adjusting the temperature compensation gain based on the operation mode and the calibration condition.

Figure 4:
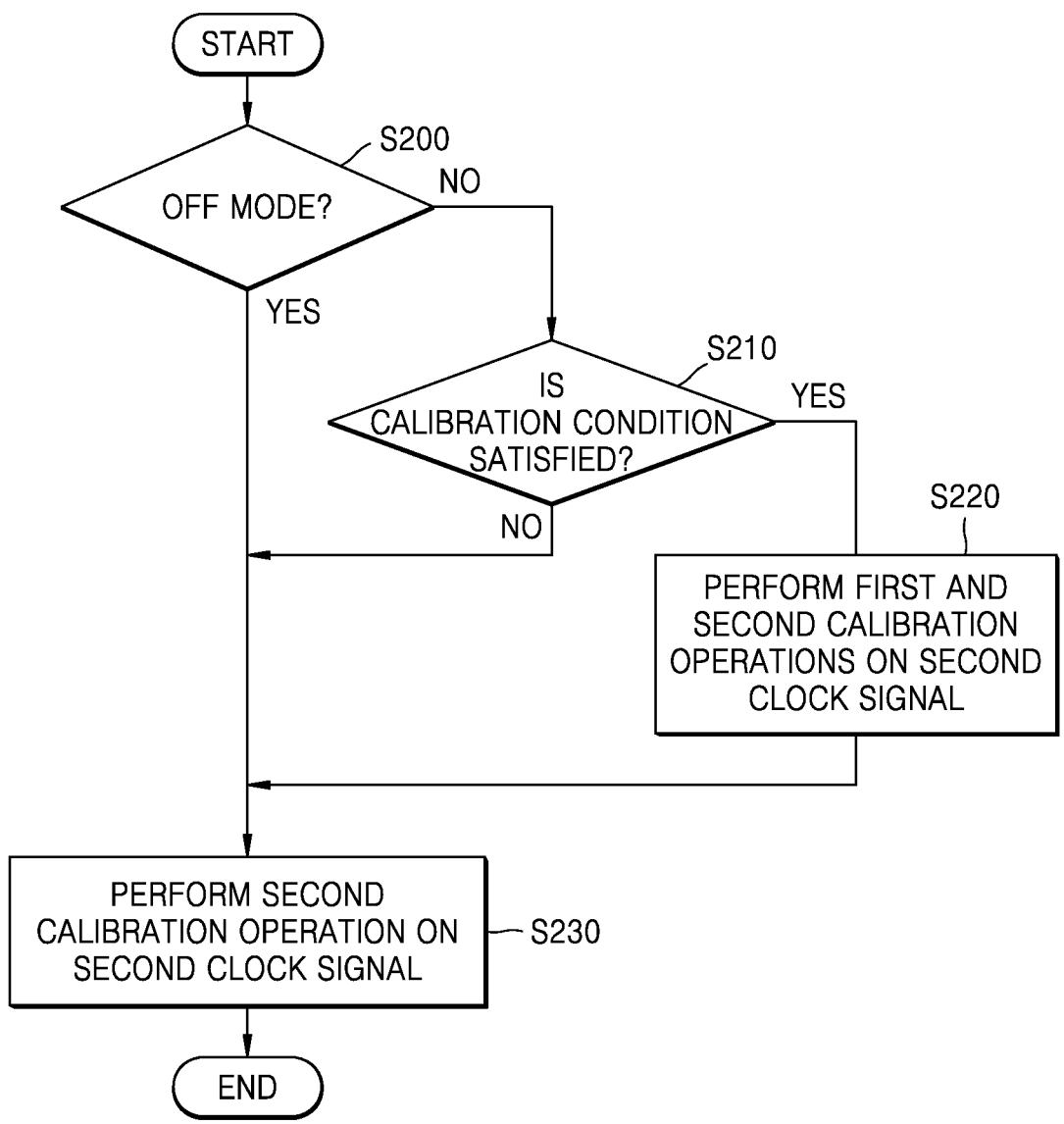
FIG. 4 is a flowchart illustrating an operation method of a control circuit in FIGS. 2A and 2B, according to an example embodiment.

FIG. 4 is a flowchart illustrating an operation method of the control circuit 123 in FIGS. 2A and 2B, according to an example embodiment. Hereinafter, it will be described with further reference to FIGS. 2A and 2B for better understanding.

Referring to FIGS. 2A and 2B and FIG. 4, in operation S200, the control circuit 123 may determine whether the clock integrated circuit 100 is in an off mode. When the clock integrated circuit 100 is not in an off mode ('No') in operation S200, that is, when the clock integrated circuit 100 is in an active mode or a calibration mode, the control circuit 123 may determine whether a calibration condition is satisfied (operation S210). In an example embodiment, the calibration condition may include at least one of whether a certain timer has expired and whether the sensed temperature $D_n$ exceeds a threshold. When a calibration condition is satisfied ('Yes') in operation S210, the control circuit 123 may perform first and second calibrations on the second clock signal $f_{RTC}$ (operation S220). Calibration with respect to the second clock signal $f_{RTC}$ may indicate an operation of adjusting the division ratio $NF_O$. When the clock integrated circuit 100 is in an off mode ('Yes') in operation S200, or when the clock integrated circuit 100 is not in an off mode and a calibration condition is not satisfied ('No') in operation S210, the control circuit 123 may perform the second calibration on the second clock signal $f_{RTC}$ in operation S230. For example, in operation S230 the first calibration operation is not performed.

In an example embodiment, the second calibration operation in operation S220 may further include an operation of adjusting a temperature compensation gain, which will be described below, and the second calibration operation in operation S220 may be performed based on an adjusted temperature compensation gain. The second calibration operation in operation S230 may be performed by omitting the operation of adjusting the temperature compensation gain and using a previously adjusted temperature compensation gain in a fixed manner.

In an example embodiment, in operation S220, the second clock signal $f_{RTC}$ may be generated and output by using a division ratio learned through a plurality of calibrations performed in the past and a temperature compensation gain according to a sensed temperature. In operation S230 following operation S220, a second clock signal $f_{RTC}$ generated by dividing the clock signal $f_{RCO}$ of the RC oscillator 121 by the division ratio $NF_O$ adjusted in operation S220 may be output.

Figure 5:
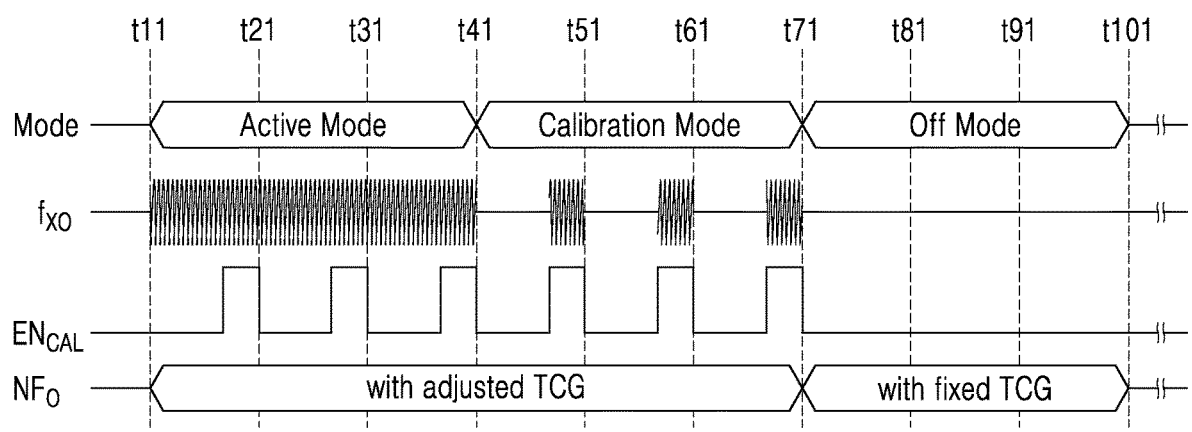
FIG. 5 is a timing diagram illustrating an operation according to an operation mode of a clock integrated circuit according to an example embodiment.

FIG. 5 is a timing diagram illustrating an operation according to an operation mode of a clock integrated circuit according to an example embodiment. Hereinafter, it will be described with further reference to FIGS. 2A and 2B for better understanding.

Referring to FIGS. 2A and 2B and FIG. 5, the clock integrated circuit 100 may operate in the active mode from 't11' to 't41', operate in the calibration mode from 't41' to 't71', and operate in the off mode from 't71' to 't101'.

In the active mode, the first clock generator 110 may be activated to continuously generate the first clock signal $f_{XO}$. In the active mode, the second clock generator 120 may be activated to continuously generate the second clock signal $f_{RTC}$. In this case, the second clock generator 120 may provide an enable signal $EN_{CAL}$ having a high level to the first clock generator 110 when a calibration condition is satisfied to control the first clock generator to generate the first clock signal $f_{XO}$, which may be received by the second clock generator 120. The second clock generator 120 may perform both the first and second calibration operations on the second clock signal $f_{RTC}$ three times from 't11' to 't41'. Specifically, the second clock generator 120 may adjust the division ratio $NF_O$ by using a reference division ratio and a temperature compensation gain.

In the calibration mode, the first clock generator 110 may be selectively activated based on the enable signal $EN_{CAL}$ to generate the first clock signal $f_{XO}$ and provide the first clock signal $f_{XO}$ to the second clock generator 120. Specifically, in the calibration mode, the first clock generator 110 may be activated during a period in which the enable signal $EN_{CAL}$ is at a high level, and may be deactivated during a period in which the enable signal ENCAL is at a low level. In FIG. 5, it is illustrated that the period in which the enable signal ENCAL is at a high level coincides with a period in which the first clock generator 110 is activated. However, this is only an example embodiment, and the present disclosure is not limited thereto. For example, as described in more detail below, the period in which the enable signal ENCAL is at a high level may be longer than the period in which the first clock generator 110 is activated. In the first calibration mode, the second clock generator 120 may be activated to continuously generate the second clock signal $f_{RTC}$. The second clock generator 120 may perform the first and second calibration operations on the second clock signal $f_{RTC}$ three times from 't41' to 't71'.

In an example embodiment, the second calibration operation in the active mode and the calibration mode may further include an operation of adjusting a temperature compensation gain TCG, and the second calibration operation may be performed using an adjusted temperature compensation gain TCG.

In the off mode, the first clock generator 110 may be deactivated and the second clock generator 120 may be activated to continuously generate the second clock signal $f_{RTC}$. However, in the off mode, the second clock generator 120 may perform a second calibration operation on the second clock signal $f_{RTC}$ by adjusting the division ratio $NF_O$ according to a temperature change between 't71' and 't101' by using, in a fixed manner, the temperature compensation gain adjusted through a second calibration operation performed at the most recent 't71'. In some example embodiments, in the off mode, the second clock generator 120 may perform a calibration operation on the second clock signal $f_{RTC}$ by using a division ratio learned in the previous active mode or calibration mode and a temperature compensation gain.

The first clock generator 110 according to an example embodiment may be activated only when the second clock generator 120 requires the first clock signal $f_{XO}$ in the calibration mode, and thus, efficient power consumption is possible.

Figure 6:
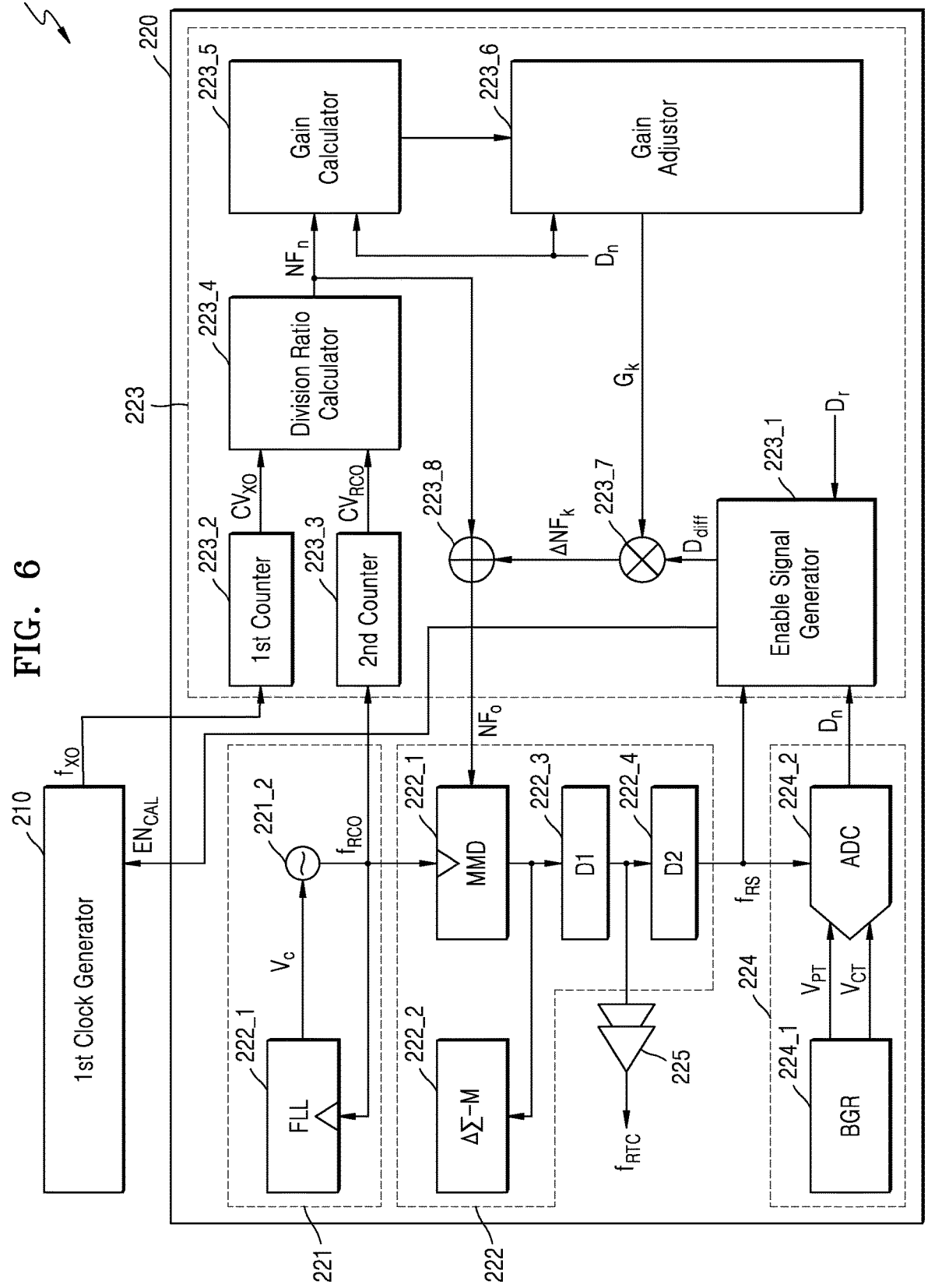
FIG. 6 is a block diagram of a clock integrated circuit according to an example embodiment.

FIG. 6 is a block diagram of a clock integrated circuit 200 according to an example embodiment.

Referring to FIG. 6, the clock integrated circuit 200 may include a first clock generator 210 and a second clock generator 220. The second clock generator 220 may include an RC oscillator 221, a division circuit 222, a control circuit 223, and a temperature sensor 224.

The RC oscillator 221 may include a frequency locked loop (FLL) circuit 221_1 and a voltage-controlled oscillator 221_2. The FLL circuit 221_1 may receive, as a feedback signal, a clock signal $f_RCO$ output from the voltage-controlled oscillator 221_2, generate a voltage signal Vc, and provide the voltage signal Vc to the voltage-controlled oscillator 221_2. The voltage-controlled oscillator 221_2 may output a frequency-fixed clock signal $f_{RCO}$ based on the voltage signal Vc.

The division circuit 222 may include a multi modulus divider 222_1, a delta sigma modulator 222_2, a first divider 222_3, and a second divider 222_4. In an example embodiment, the delta sigma modulator 222_2 may quantize a fractional part of a division ratio $NF_O$ received from the control circuit 223 into n bits (where n is an integer greater than or equal to 1), and may adjust a division ratio of the multi modulus divider 222_1 to match the received division ratio $NF_O$ by adding a result of the quantization to an integer part of the division ratio $NF_O$. The multi modulus divider 222_1 may be referred to as a divider having a variable division ratio. The output of the multi modulus divider 222_1 may be divided at a fixed division ratio by the first divider 222_3, and may pass through a sixth buffer circuit 225 to be output as the second clock signal $f_{RTC}$. In addition, the output of the multi modulus divider 222_1 may be divided at a fixed division ratio by the first divider 222_3 and the second divider 222_4, and the output signal of the second divider 222_4 may be provided to an enable signal generator 223_1 as a reference clock signal $f_{RS}$.

In an example embodiment, the temperature sensor 224 may include a band gap reference circuit 224_1 and an analog-to-digital converter 224_2. The band gap reference circuit 224_1 may generate a temperature proportional voltage signal $V_{PT}$ proportional to the temperature of the clock integrated circuit 200 and a temperature inverse proportional voltage signal $V_{CT}$ inversely proportional to the temperature of the clock integrated circuit 200. The band gap reference circuit 224_1 may provide the temperature proportional voltage signal $V_{PT}$ and the temperature inverse proportional voltage signal $V_{CT}$ to the analog-to-digital converter 224_2. The analog-to-digital converter 224_2 may convert a difference between the temperature proportional voltage signal VPT and the temperature inverse proportional voltage signal VCT to generate a sensed temperature $D_n$. The analog-to-digital converter 224_2 may provide the sensed temperature $D_n$ to the enable signal generator 223_1. The temperature sensor 224 according to an example embodiment may consume low power and may provide a high-accuracy sensed temperature $D_n$ to the enable signal generator 223_1.

The control circuit 223 may include the enable signal generator 223_1, a first counter 223_2, a second counter 223_3, a division ratio calculator 223_4, a gain calculator 223_5, a gain adjustor 223_6, a multiplier 223_7, and an adder 223_8.

In an example embodiment, the first calibration operation described above may be performed using the first counter 223_2, the second counter 223_3, and the division ratio calculator 223_4, and the second calibration operation described above may be performed using the gain calculator 223_5, the gain adjustor 223_6, the multiplier 223_7, and the adder 223_8.

In an example embodiment, a temperature compensation gain $G_n$ may be adjusted using the gain calculator 223_5 and the gain adjustor 223_6 in a second calibration operation in the active mode or the calibration mode, and an adjusted temperature compensation gain $G_k$ may be stored in the gain adjustor 223_6 or a separate register. In an example embodiment, in a second calibration operation in the off mode, the temperature compensation gain $G_k$ stored in the gain adjustor 223_6 or a separate register may be used without generating and adjusting the temperature compensation gain $G_n$.

The first counter 223_2 may generate a first counting result $CV_{XO}$ by counting the number of edges (rising edges or falling edges) of the first clock signal $f_{XO}$ of the first clock generator 210 for a certain time. The second counter 223_3 may generate a second counting result $CV_{RCO}$ by counting the number of edges (rising edges or falling edges) of the clock signal $f_{RCO}$ of the RC oscillator 221 for a certain time. For example, the certain time is a time between a start time and an end time, and the start time and the end time may be preset based on the operation of the second counter 223_3. In an example embodiment, the second counter 223_3 may provide a signal for informing the first counter 223_2 of the start time and the end time, and the first counter 223_2 may count the first clock signal $f_{XO}$ based on the signal.

In an example embodiment, the division ratio calculator 223_4 may calculate a first division ratio $NF_n$ by using the first counting result $CV_{XO}$ and the second counting result $CV_{RCO}$ and provide the first division ratio $NF_n$ to the gain calculator 223_5 and the adder 223_8. The division ratio calculator 223_4 may operate based on Equation 1 below.

$$NF_n = \frac{f_{CLK1}}{f_{target}} \times \frac{CV_{RCO}}{CV_{XO}} \qquad \text{[Equation 1]}$$

Specifically, the division ratio calculator 223_4 may calculate the first division ratio $NF_n$ by multiplying a first value by a second value, wherein the first value is obtained by dividing a frequency $f_{CLK1}$ of the first clock signal $f_{XO}$ by a target frequency $f_{target}$ of the second clock signal $f_{RTC}$, and the second value is obtained by dividing the second counting result $CV_{RCO}$ by the first counting result $CV_{XO}$.

In an example embodiment, the gain calculator 223_5 may receive the first division ratio $NF_n$ and the sensed temperature $D_n$ and generate a temperature compensation gain $G_n$, based on the first division ratio $NF_n$ and the sensed temperature $D_n$. The gain calculator 223_5 may operate based on Equation 2 below.

$$G_n = \frac{NF_n - NF_r}{D_n - D_r} \quad \text{[Equation 2]}$$

Specifically, the gain calculator 223_5 may calculate the temperature compensation gain $G_n$ by dividing a difference between the first division ratio $NF_n$ and a reference division ratio $NF_r$ by a difference between the sensed temperature $D_n$ and a reference temperature $D_r$. The reference division ratio $NF_r$ may be set to a first division ratio previously calculated by the division ratio calculator 223_4, and the reference temperature $D_r$ may be set to a sensed temperature previously generated by the temperature sensor 224. In addition, after completing the calculation of the temperature compensation gain $G_n$, the gain calculator 223_5 may update the current first division ratio $NF_n$ to the reference division ratio $NF_r$ for the next calibration operation of the gain calculator 223_5, and may update the current sensed temperature $D_n$ to the reference temperature $D_r$ for the next calibration operation of the gain calculator 223_5. The gain calculator 223_5 may provide the generated temperature compensation gain $G_n$ to the gain adjustor 223_6.

In an example embodiment, the gain adjustor 223_6 may generate an adjusted temperature compensation gain $G_k$ by adjusting the temperature compensation gain $G_n$ based on the sensed temperature $D_n$. Specifically, the gain adjustor 223_6 may include a plurality of adjustment paths, which correspond to a plurality of temperature ranges, respectively, and may adjust the temperature compensation gain $G_n$ through an adjustment path corresponding to a range to which the sensed temperature $D_n$ belongs from among the plurality of adjustment paths. Through the operation of the gain adjustor 223_6 according to an example embodiment, the effect of nonlinearity caused by a temperature change of the internal resistance of the RC oscillator 221 may be removed. Through this, the overall linearity of the second clock generator 220 may be improved. Details regarding the gain adjustor 223_6 are described below.

In an example embodiment, the enable signal generator 223_1 may receive the sensed temperature $D_n$, the reference clock signal $f_{RS}$, and the reference temperature $D_r$ and generate the enable signal ENCAL based on the sensed temperature $D_n$, the reference clock signal $f_{RS}$, and the reference temperature $D_r$. Specifically, the enable signal generator 223_1 may include a timer that counts time in synchronization with the reference clock signal $f_{RS}$, and may generate an enable signal $EN_{CAL}$ transitioned from a low level to a high level when the timer expires. Also, the enable signal generator 223_1 may generate an enable signal $EN_{CAL}$ transitioned from a low level to a high level when a difference $D_{diff}$ between the sensed temperature $D_n$ and the reference temperature $D_r$ exceeds a threshold. That is, the enable signal generator 223_1 may determine whether or not the calibration condition described above is satisfied by using the sensed temperature $D_n$, the reference clock signal $f_{RS}$, and the reference temperature $D_r$, and may generate an enable signal $EN_{CAL}$ having a level corresponding to a result of the determination. The enable signal generator 223_1 may provide a difference $D_{diff}$ between the sensed temperature $D_n$ and the reference temperature $D_r$ to the multiplier 223_7. In addition, as an example, the enable signal generator 223_1 may receive the sensed temperature $D_n$ from the temperature sensor 224, in each of the modes including the active mode, the calibration mode and the off mode, and continuously provide the difference $D_{diff}$ between the sensed temperature $D_n$ and the reference temperature $D_r$ to the multiplier 223_7.

In an example embodiment, the multiplier 223_7 may generate a delta division ratio $\Delta NF_k$ by multiplying the difference $D_{diff}$ received from the enable signal generator 223_1 by the temperature compensation gain $G_k$, and may provide the delta division ratio $\Delta NF_k$ to the adder 223_8. Also, as an example, the multiplier 223_7 may receive a variable temperature compensation gain $G_k$ in the active mode or the calibration mode, and may receive a fixed temperature compensation gain $G_k$ in the off mode.

In an example embodiment, the adder 223_8 may adjust the division ratio $NF_O$ to a second division ratio by adding the received delta division ratio $\Delta NF_k$ to the first division ratio $NF_n$. In the active mode or the calibration mode, the adder 223_8 may receive a first division ratio $NF_n$ calculated by the division ratio calculator 223_4 to generate the division ratio $NF_O$. In the off mode, the adder 223_8 may receive a first division ratio $NF_n$ most recently calculated and stored in the active mode or the calibration mode to generate the division ratio $NF_O$.

In an example embodiment, the control circuit 223 may calculate the first division ratio $NF_n$ in the active mode or the calibration mode and adjust the temperature compensation gain $G_n$ to generate the delta division ratio $\Delta NF_k$. In the off mode, the control circuit 223 may generate the delta division ratio $\Delta NF_k$ by using a previous first division ratio $NF_n$ and a previously adjusted temperature compensation gain $G_k$ without separate calculation or adjustment for the first division ratio $NF_n$ and the temperature compensation gain $G_n$.

In an example embodiment, the control circuit 223 may be implemented to perform learning through synthesis. For example, the control circuit 223 may learn weights, coefficients, or parameters necessary for generating at least one of the first division ratio $NF_n$, the temperature compensation gain $G_k$, the delta division ratio $\Delta NF_k$, and the division ratio $NF_O$. Also, in an example embodiment, a plurality of adjustment paths of the gain adjustor 223_6 may be learned and set.

Figure 7:
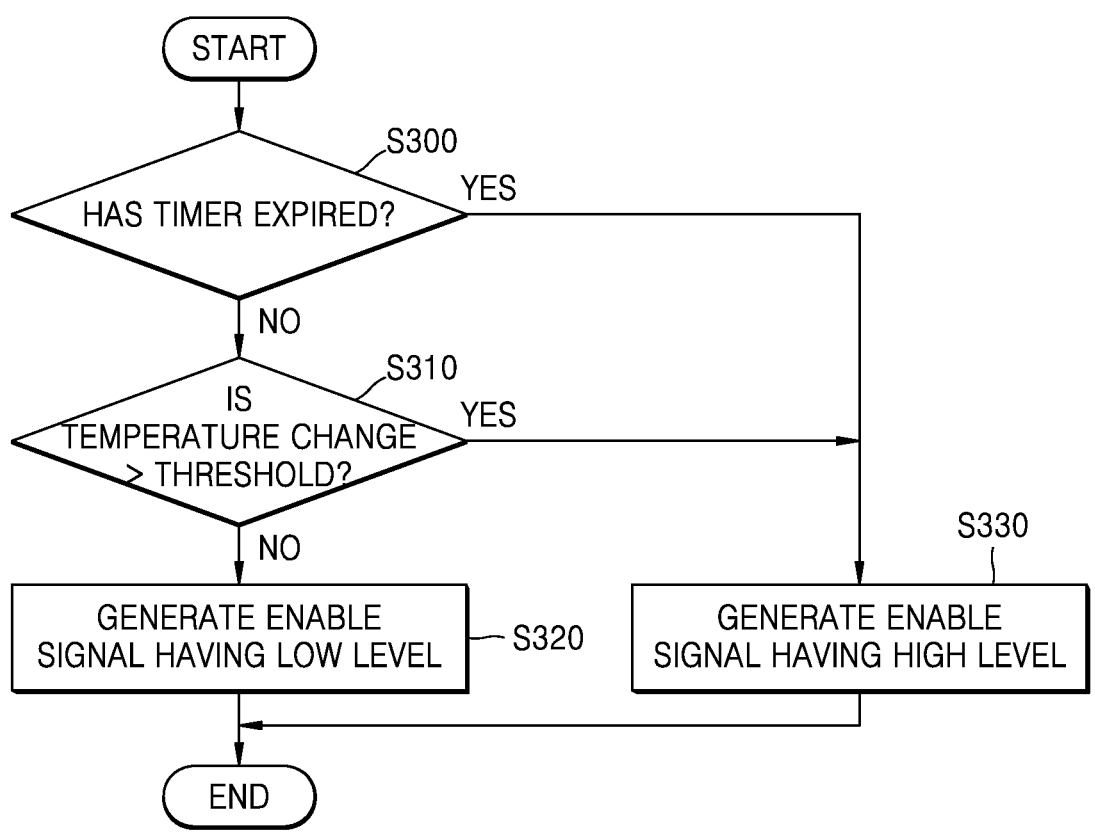
FIG. 7 is a flowchart illustrating an operation method of an enable signal generator in FIG. 6, according to an example embodiment.

FIG. 7 is a flowchart illustrating an operation method of the enable signal generator 223_1 in FIG. 6, according to an example embodiment. Hereinafter, it will be described with further reference to FIG. 6 for better understanding. The operation of the enable signal generator 223_1 may indicate an operation of the control circuit 223.

Referring to FIGS. 6 and 7, in operation S300, the enable signal generator 223_1 may determine whether a certain timer has expired. The certain timer may be reset upon completion of the immediately preceding calibration operation to count time, and may expire when counting is performed for a preset time. When the certain timer has not expired in operation S300 ('No'), operation S310 is performed, and in operation S310, the enable signal generator 223_1 may determine whether a change in the sensed temperature $D_n$ exceeds a threshold. In an example embodiment, the enable signal generator 223_1 may receive a sensed temperature $D_n$ periodically generated by the temperature sensor 224, compare the sensed temperature $D_n$ with the reference temperature $D_r$, and determine whether a difference between the sensed temperature $D_n$ and the reference temperature $D_r$ exceeds a threshold. When the change in the sensed temperature $D_n$ does not exceed the threshold in operation S310 ('No'), operation S320 is performed, and in operation S320, the enable signal generator 223_1 may generate the enable signal $EN_{CAL}$ having a low level and the operation S300 may be performed again. That is, when the certain timer has not expired in operation S300 ('No') and the change in the sensed temperature $D_n$ does not exceed the threshold in operation S310 ('No'), a calibration condition is not satisfied, and thus, the enable signal generator 223_1 may generate the enable signal $EN_{CAL}$ having a low level and the control circuit 223 may not perform an adjustment operation for the temperature compensation gain $G_n$ during the first and second calibration operations. The control circuit 223 may perform the remaining second calibration operation by using the sensed temperature $D_n$, the previously adjusted temperature compensation gain $G_k$, and the previously calculated first division ratio $NF_n$. When the certain timer has expired in operation S300 ('Yes') or when the change in the sensed temperature $D_n$ exceeds the threshold in operation S310 ('Yes'), operation S330 is performed, and in operation S330, the enable signal generator 223_1 may generate the enable signal $EN_{CAL}$ having a high level. That is, when the certain timer has expired in operation S300 ('Yes') or when the change in the sensed temperature $D_n$ exceeds the threshold in operation S310 ('Yes'), the calibration condition is satisfied, and thus, the enable signal generator 223_1 may generate the enable signal $EN_{CAL}$ having a high level and the control circuit 223 may perform the first and second calibration operations.

Figure 8:
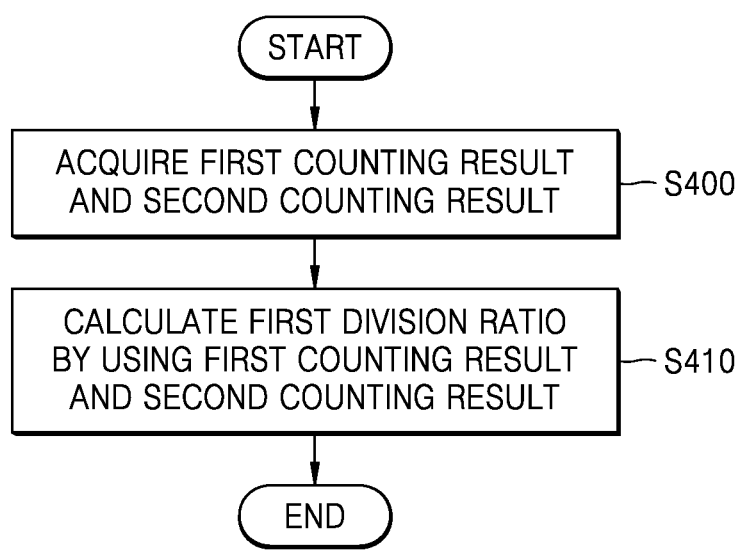
FIG. 8 is a flowchart illustrating an operation method of a division ratio calculator in FIG. 6, according to an example embodiment.

FIG. 8 is a flowchart illustrating an operation method of the division ratio calculator 223_4 in FIG. 6, according to an example embodiment. Hereinafter, it will be described with further reference to FIG. 6 for better understanding. The operation of the division ratio calculator 223_4 may indicate an operation of the control circuit 223.

Referring to FIGS. 6 and 8, in operation S400, the division ratio calculator 223_4 may acquire the first counting result $CV_{XO}$ and the second counting result $CV_{RCO}$ respectively generated by the first counter 223_2 and the second counter 223_3 based on the enable signal $EN_{CAL}$ having a high level. In operation S410, the division ratio calculator 223_4 may calculate the first division ratio $NF_n$ by using the first counting result $CV_{XO}$ and the second counting result $CV_{RCO}$. In an example embodiment, the division ratio calculator 223_4 may calculate the first division ratio $NF_n$ by multiplying a first value by a second value, wherein the first value is obtained by dividing the frequency $f_{CLK1}$ of the first clock signal $f_{XO}$ by the target frequency $f_{target}$ of the second clock signal $f_{RTC}$, and the second value is obtained by dividing the second counting result $CV_{RCO}$ by the first counting result $CV_{XO}$. In some example embodiments, the division ratio calculator 223_4 may calculate the first division ratio $NF_n$ by applying different weights to the first counting result $CV_{XO}$ and the second counting result $CV_{RCO}$, and the weights may be determined by certain learning.

In an example embodiment, the division ratio calculator 223_4 may store and update the first division ratio $NF_n$, and in the off mode, the division ratio calculator 223_4 may provide the most recently stored first division ratio $NF_n$ to the adder 223_8.

Figure 9:
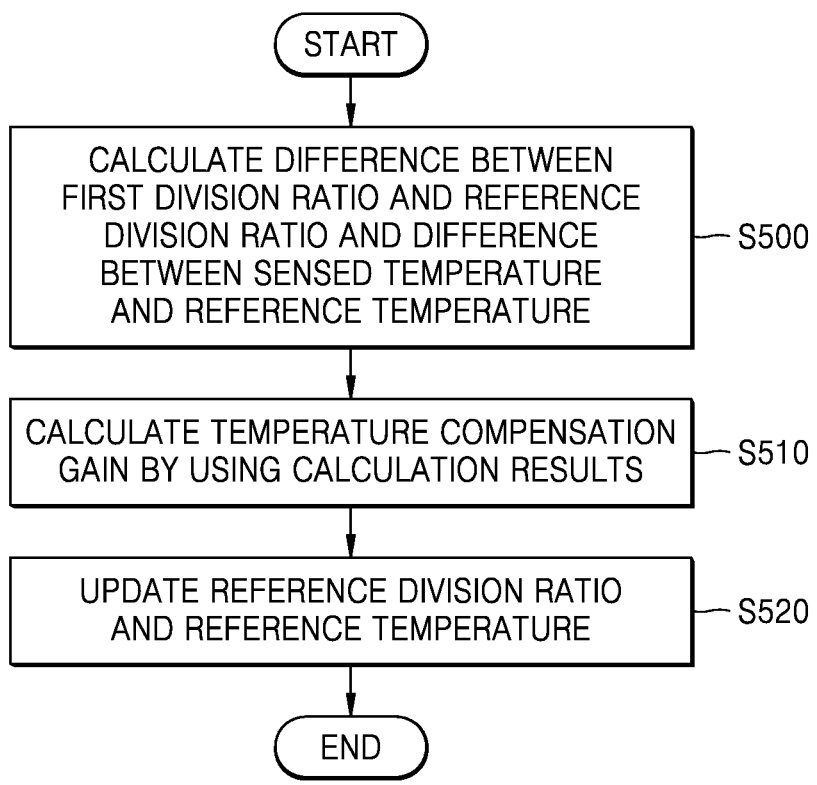
FIG. 9 is a flowchart illustrating an operation method of a gain calculator in FIG. 6, according to an example embodiment.

FIG. 9 is a flowchart illustrating an operation method of the gain calculator 223_5 in FIG. 6, according to an example embodiment. Hereinafter, it will be described with further reference to FIG. 6 for better understanding. The operation of the gain calculator 223_5 may indicate an operation of the control circuit 223.

Referring to FIGS. 6 and 9, in operation S500, the gain calculator 223_5 may calculate a difference between the first division ratio $NF_n$ and the reference division ratio $NF_r$, and a difference between the sensed temperature $D_n$ and the reference temperature $D_r$. In operation S510, the gain calculator 223_5 may calculate the temperature compensation gain $G_n$ by using the calculation results. In an example embodiment, the gain calculator 223_5 may calculate the temperature compensation gain $G_n$ by dividing the difference between the first division ratio $NF_n$ and the reference division ratio $NF_r$ by the difference between the sensed temperature $D_n$ and the reference temperature $D_r$. In some example embodiments, the gain calculator 223_5 may calculate the difference between the first division ratio $NF_n$ and the reference division ratio $NF_r$ by applying different weights to the first division ratio $NF_n$ and the reference division ratio $NF_r$, respectively, or may calculate the difference between the sensed temperature $D_n$ and the reference temperature $D_r$ by applying different weights to the sensed temperature $D_n$ and the reference temperature $D_r$, respectively. The weights may be determined by certain learning. In operation S520, the gain calculator 223_5 may update the current first division ratio $NF_n$ and the current sensed temperature $D_n$, used in the calculation of the temperature compensation gain $G_k$, to the reference division ratio $NF_r$ and the reference temperature $D_r$ for a next calibration operation, respectively.

Figure 10:
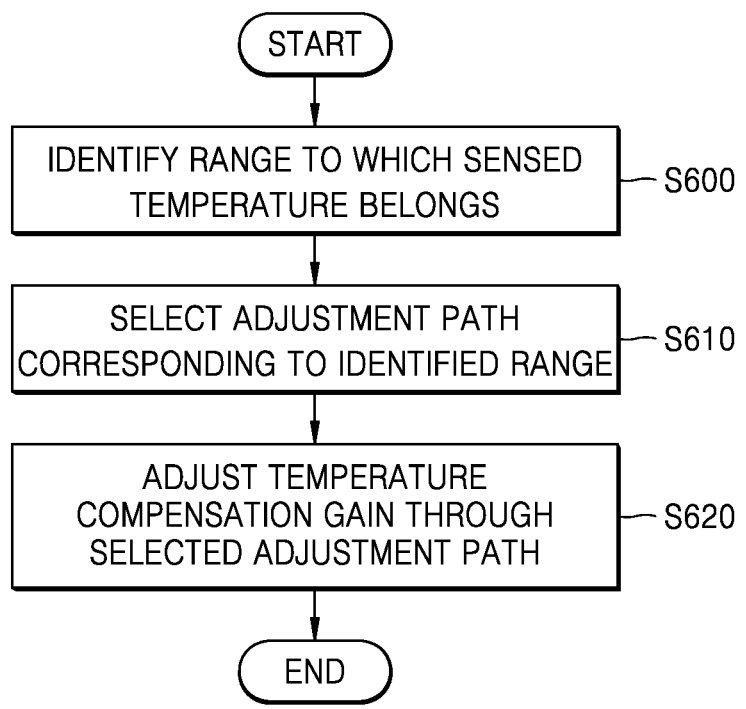
FIG. 10 is a flowchart illustrating an operation method of a gain adjustor in FIG. 6, according to an example embodiment.

FIG. 10 is a flowchart illustrating an operation method of the gain adjustor 223_6 in FIG. 6, according to an example embodiment. Hereinafter, it will be described with further reference to FIG. 6 for better understanding. The operation of the gain adjustor 223_6 may indicate an operation of the control circuit 223.

Referring to FIGS. 6 and 10, in operation S600, the gain adjustor 223_6 may identify a range to which the sensed temperature $D_n$ belongs. In operation S610, the gain adjustor 223_6 may select an adjustment path corresponding to the identified range from among a plurality of adjustment paths. The plurality of adjustment paths are configured to adjust the temperature compensation gain $G_n$, and may differently adjust the temperature compensation gain $G_n$. In operation S620, the gain adjustor 223_6 may adjust the temperature compensation gain $G_n$ through the selected adjustment path. The adjusted temperature compensation gain $G_k$ may be used to generate the delta division ratio $\Delta NF_k$.

Figure 11:
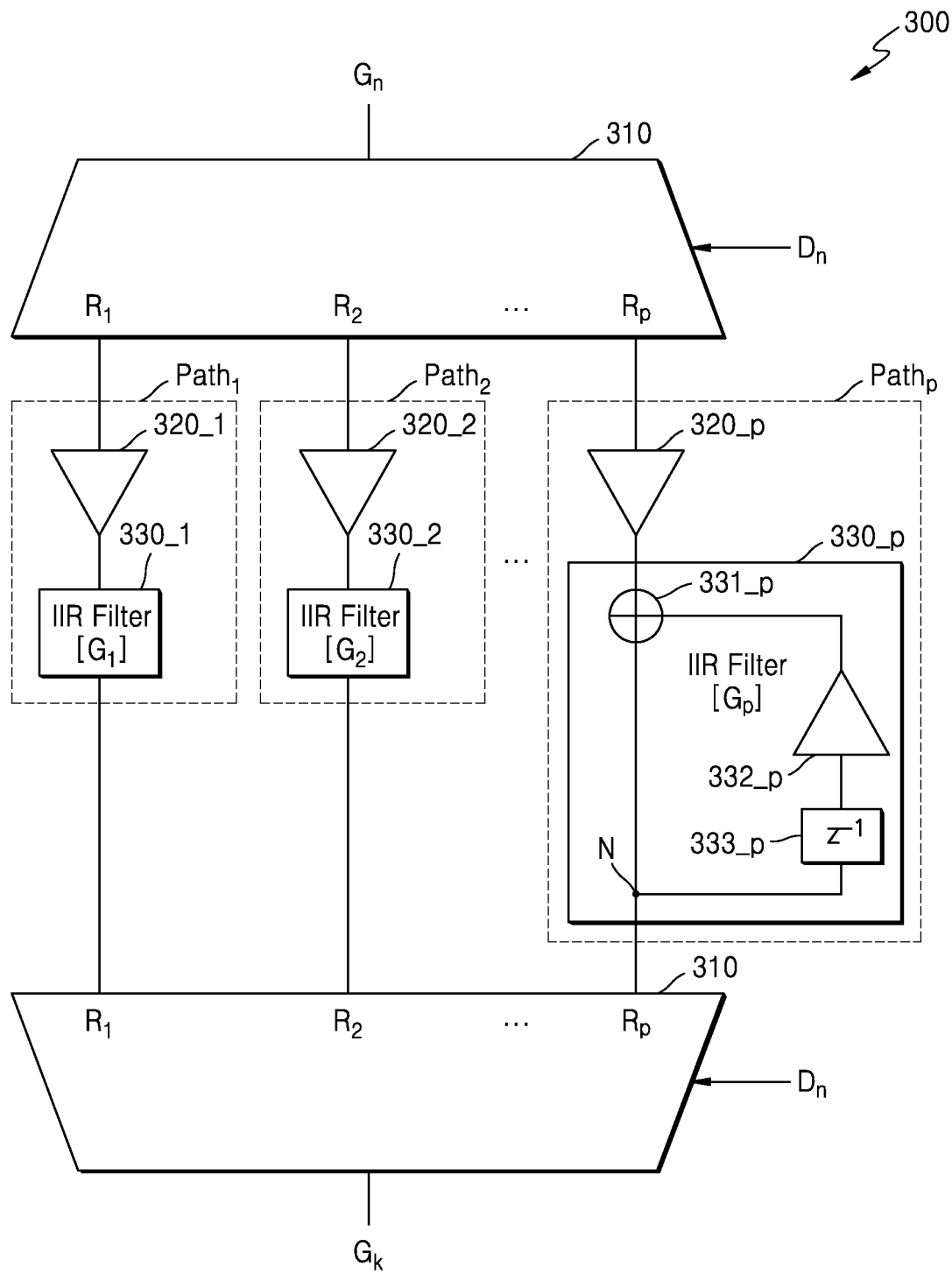
FIG. 11 is a detailed block diagram of a gain adjustor according to an example embodiment.

FIG. 11 is a detailed block diagram of a gain adjustor 300 according to an example embodiment.

Referring to FIG. 11, the gain adjustor 300 may include a path selector 310 and first to p-th (where p is an integer greater than or equal to 2) adjustment paths $Path_1$ to $Path_p$. The first to p-th adjustment paths $Path_1$ to $Path_p$ may respectively correspond to first to p-th ranges $R_1$ to $R_p$. The first to p-th ranges $R_1$ to $R_p$ may be set by dividing the operating temperature range of the clock integrated circuit 200 by p. The path selector 310 may select an adjustment path according to a range, from among the divided operating temperature ranges, to which the current sensed temperature $D_n$ belongs from among the first to p-th adjustment paths $Path_1$ to $Path_p$.

In an example embodiment, the p-th adjustment path $Path_p$ may include a first amplifier 320_p and an infinite impulse response (IIR) filter 330_p. The IIR filter 330_p may include an adder 331_p, a converter 333_p, and a second amplifier 332_p. The temperature compensation gain $G_n$ that has passed through the IIR filter 330_p may be adjusted as in Equation 3 below.

$$G_k = c_1 G_p Z^{-1} + c_0 G_n \therefore c_1 = 1 - c_0 \qquad \text{[Equation 3]}$$

The gain adjustor 300 may calculate the adjusted temperature compensation gain $G_k$ by adding a result, obtained as the product of a gain $c_1$ of the second amplifier 332_p and a gain $G_p$ of the IIR filter 330_p at an internal node N passes through the converter 333_p, to the product of a gain $c_0$ of the first amplifier 320_p and the temperature compensation gain $G_n$. The configuration and operation of the p-th adjustment path Path$_p$ may also be applied to the first to (p-1)-th adjustment paths Path$_1$ to Path$_{p-1}$.

In an example embodiment, in the first to p-th adjustment paths Path$_1$ to Path$_p$, the gains of IIR filters 330_1 to 330_p, the gains $c_0$ of first amplifiers 320_1 to 320_p, and the gains $c_1$ of second amplifiers 332_1 to 332_p may be set based on certain learning.

In some example embodiments, the first to p-th adjustment paths Path$_1$ to Path$_p$ may each include a finite impulse response (FIR) filter instead of an IIR filter.

The gain adjustor 300 according to an example embodiment may improve the linearity of a temperature compensation for the second clock signal through an adjustment operation for the temperature compensation gain $G_n$, in which a range to which the sensed temperature $D_n$ belongs is considered.

Figure 12:
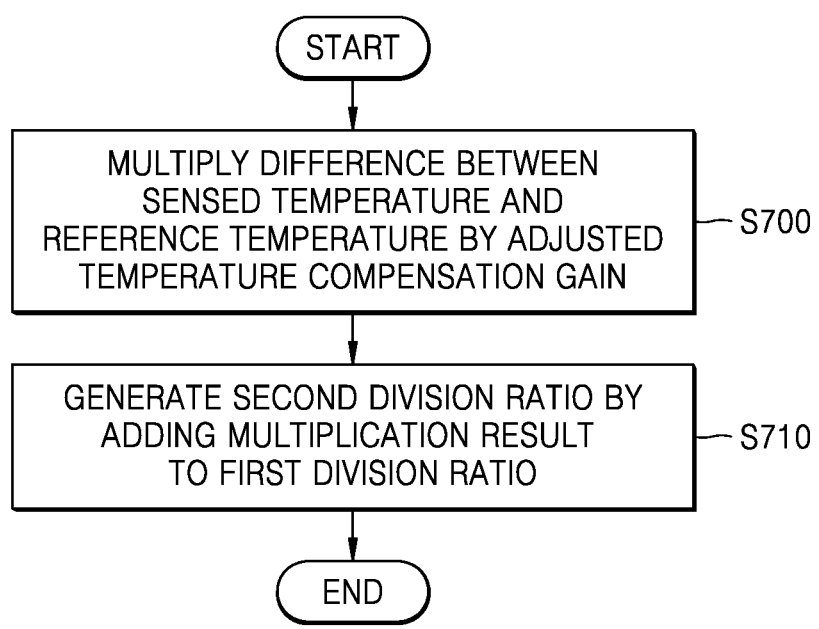
FIG. 12 is a flowchart illustrating an operation method of a multiplier and an adder in FIG. 6, according to an example embodiment.

FIG. 12 is a flowchart illustrating an operation method of the multiplier 223_7 and the adder 223_8 in FIG. 6, according to an example embodiment. Hereinafter, it will be described with further reference to FIG. 6 for better understanding. The operations of the multiplier 223_7 and the adder 223_8 may indicate operations of the control circuit 223.

Referring to FIG. 12, in operation S700, the multiplier 227_1 may multiply the difference between the sensed temperature $D_n$ and the reference temperature $D_r$ by the adjusted temperature compensation gain $G_k$. In operation S710, the adder 223_8 may generate a final division ratio $NF_O$ by adding the delta division ratio $\Delta NF_k$ corresponding to the multiplication result to the first division ratio $NF_n$. By providing the final division ratio $NF_O$ from the adder 223_8 to the division circuit 222, the calibration operation of the control circuit 223 may be completed, and the control circuit 223 may wait to perform a next calibration operation.

Figure 13:
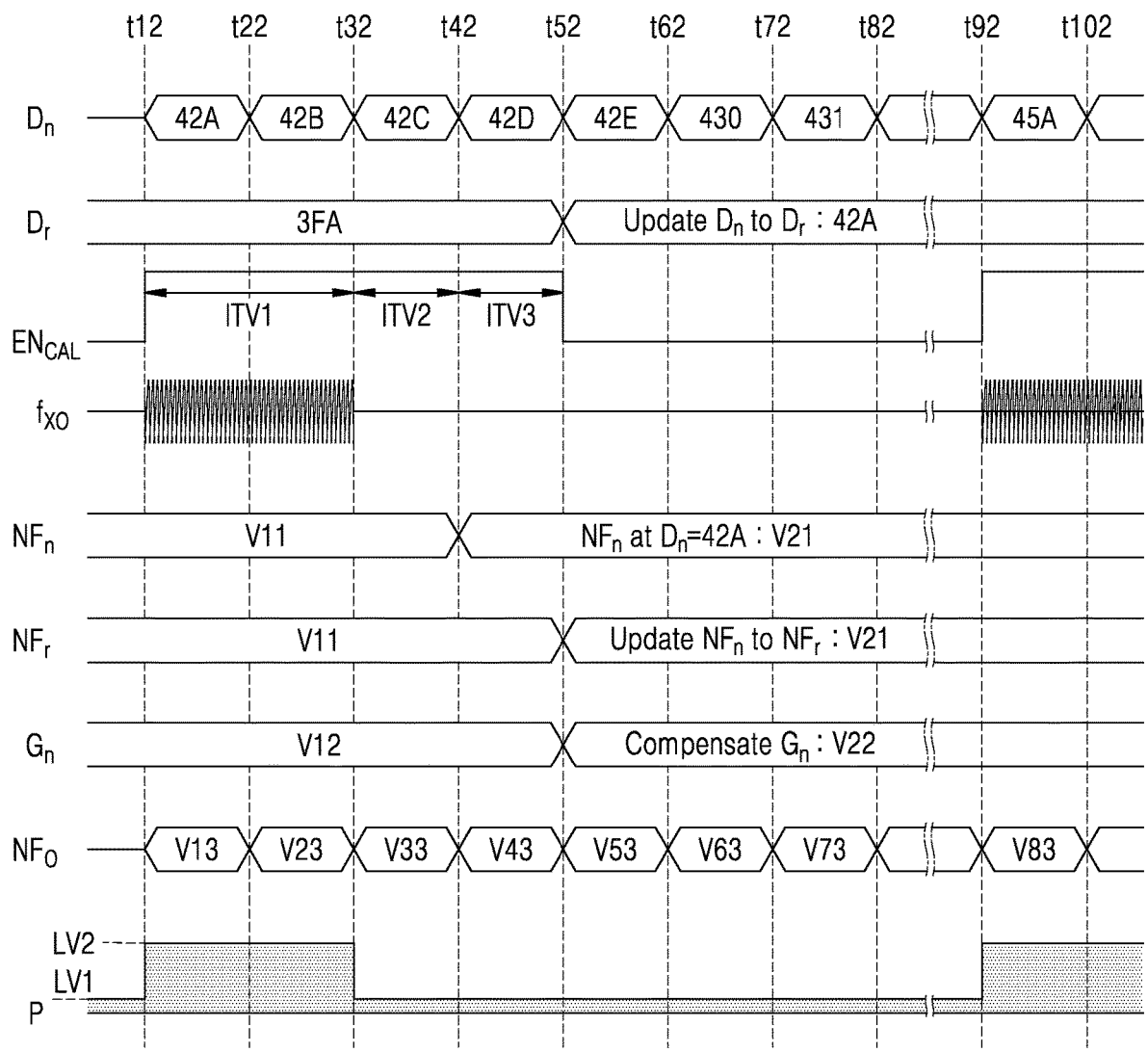
FIG. 13 is a timing diagram specifically illustrating an operation of a clock integrated circuit in a calibration mode, according to an example embodiment.

FIG. 13 is a timing diagram specifically illustrating an operation of a clock integrated circuit in a calibration mode, according to an example embodiment. Hereinafter, it will be described with further reference to FIG. 6 for better understanding. Hereinafter, it is assumed that the second clock generator 200 performs a first calibration operation and a second calibration operation including an adjustment operation for the temperature compensation gain $G_n$ from 't12' to 't52', performs a second calibration operation that does not include an adjustment operation for the temperature compensation gain $G_n$ from 't52' to 't92', and performs a first calibration operation and a second calibration operation including an adjustment operation for the temperature compensation gain $G_n$ after 't92'.

Referring to FIGS. 6 and 13, the sensed temperature $D_n$ may be changed to '42A, 42B, 42C, and 42D' over 't12' to 't52', and the reference temperature $D_r$ may be set to '3FA'. The enable signal generator 223_1 may generate the enable signal $EN_{CAL}$ having a high level from 't12' to 't52'. In a first period ITV1, the first clock generator 210 may generate a first clock signal $f_{XO}$ based on the enable signal $EN_{CAL}$ and provide the first clock signal $f_{XO}$ to the control circuit 223, the first counter 223_2 may perform a counting operation on the first clock signal $f_{XO}$, and the second counter 223_3 may perform a counting operation on the clock signal $f_{RCO}$ of the RC oscillator 221. In a second period ITV2, the division ratio calculator 223_4 may calculate the first division ratio $NF_n$ by using the first counting result $CV_{XO}$ and the second counting result $CV_{RCO}$. After 't42' at which the second period ITV2 ends, the first division ratio $NF_n$ may be changed from 'V11' to 'V21'. In a third period ITV3, the gain calculator 223_5 may generate the temperature compensation gain $G_n$ by using the first division ratio $NF_n$. The reference temperature $D_r$ may be updated from '3FA' to '42A' after 't52' at which the third period ITV3 ends. The reference division ratio $NF_r$ may be updated from 'V11' to 'V21' after 't52' at which the third period ITV3 ends. In addition, the temperature compensation gain $G_n$ may be changed from 'V12' to 'V22' after 't52' at which the third period ITV3 ends. As described above, the operations of the gain adjustor 223_6, the multiplier 223_7, and the adder 223_8 may be performed in the third period ITV3. The control circuit 223 may perform a first calibration operation and a second calibration operation to change the frequency division ratio $NF_O$ to values of 'V13', 'V23', 'V33', and 'V43'.

From 't52' to 't92', the enable signal generator 223_1 may generate the enable signal $EN_{CAL}$ having a low level until the calibration condition described above is satisfied, and the control circuit 223 may monitor whether a calibration condition for the first calibration operation and adjusting the temperature compensation gain $G_n$ is satisfied. The control circuit 223 may perform a second calibration operation on the division ratio $NF_O$ by using the first division ratio $NF_n$ calculated from 't12' to 't52' and having a value of 'V21' and the temperature compensation gain $G_n$ adjusted from 't12' to 't52' and having a value of 'V22'. As a result, the division ratio $NF_O$ may be changed to values such as 'V53', 'V63', and V73' according to a change in the sensed temperature $D_n$. Thereafter, at 't92', the enable signal generator 223_1 may generate the enable signal $EN_{CAL}$ having a high level when the difference between the sensed temperature $D_n$ and the reference temperature $D_r$ exceeds a threshold or the timer expires by the time between 't52' and 't92', and the control circuit 223 may perform the first calibration operation and the second calibration operation. The control circuit 223 may perform the first calibration operation and the second calibration operation to change the division ratio $NF_O$ to a value such as 'V83'.

According to an example embodiment, the first clock generator 210 may be activated in a portion of the high-level period of the enable signal $EN_{CAL}$ in the calibration mode to generate the first clock signal $fX_O$. Accordingly, a consumed power P of the clock integrated circuit 200 may be a second level LV2 in the portion of the high-level period of the enable signal $EN_{CAL}$ and be a first level LV1 in the remaining portion.

Figure 14:
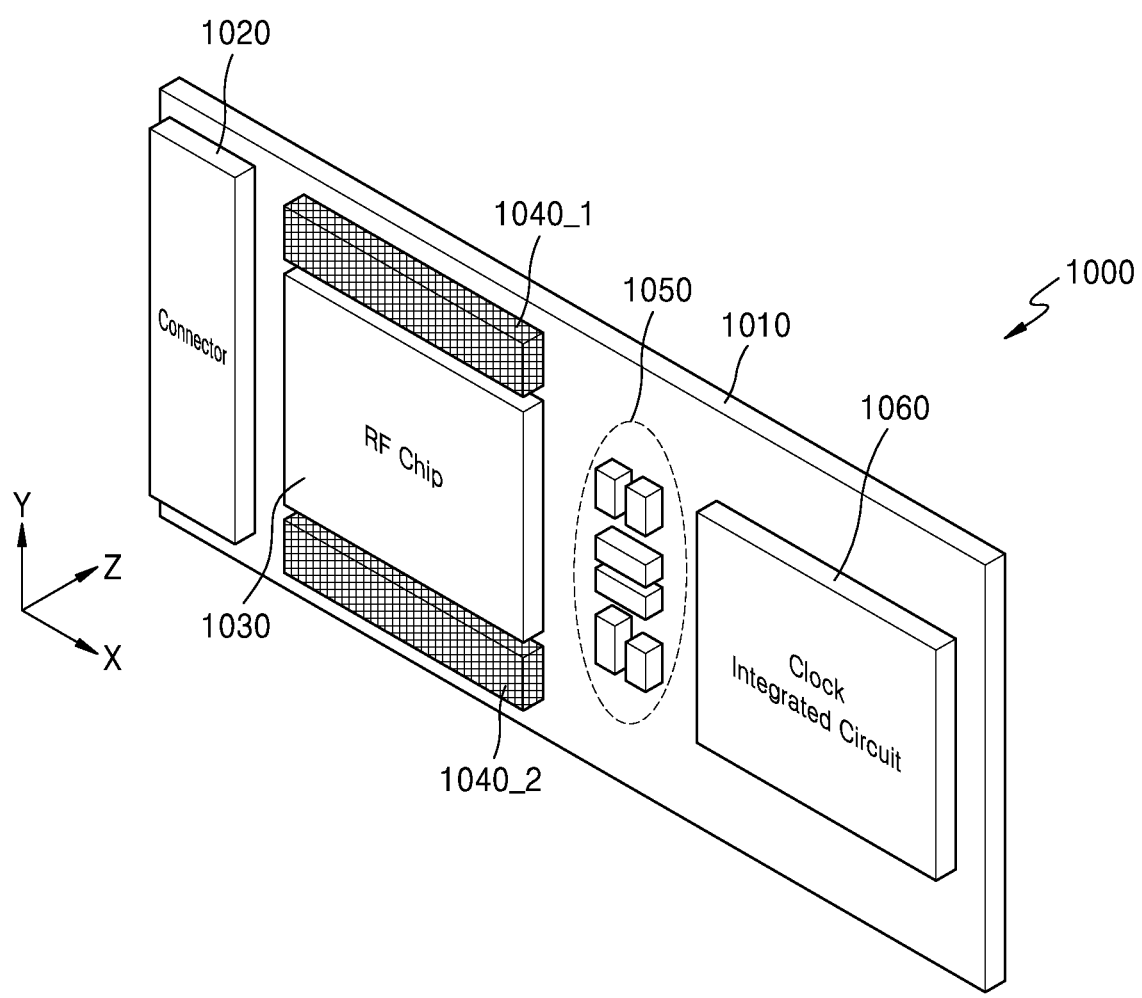
FIG. 14 illustrates a communication module according to an example embodiment.

FIG. 14 illustrates a communication module 1000 according to an example embodiment. Hereinafter, a Z-axis direction may be referred to as a vertical direction, and a component arranged in a +Z-axis direction relative to other components may be referred to as being above other components, and a component arranged in a −Z-axis direction relative to other components may be referred to as being below other components. In addition, among the surfaces of a component, a surface exposed in the +Z-axis direction may be referred to as the upper surface of the component, a surface exposed in the −Z-axis direction may be referred to as the lower surface of the component, and a surface exposed in a direction perpendicular to the Z-axis may be referred to as the side surface of the component.

Referring to FIG. 14, the communication module 1000 may include a multi-layer substrate 1010, and may include a connector 1020, a radio frequency (RF) chip 1030, antenna arrays 1040_1 and 1040_2, discrete devices 1050, and a clock integrated circuit 1060 on the lower surface of the multi-layer substrate 1010.

The multi-layer substrate 1010 may include a plurality of layers, and the plurality of layers may include the same material or different materials and may include conductive layers. In some example embodiments, the multi-layer substrate 1010 may be a printed circuit board (PCB). The multi-layer substrate 1010 may include an antenna including a pattern formed on at least one layer, and the antenna may be configured to transmit and receive electromagnetic waves through the upper surface of the multi-layer substrate 1010, that is, in the Z-axis direction. In addition, the multi-layer substrate 1010 may include a pattern for connecting the RF chip 1030 to the antenna arrays 1040_1 and 1040_2, and a pattern for connecting the RF chip 1030 to the clock integrated circuit 1060.

The connector 1020 may be connected to a cable and/or another connector, and may provide an interface between the communication module 1000 and an external component. For example, the connector 1020 may receive a voltage and/or current for supplying power to the communication module 1000 and transmit the voltage and/or current to a power management integrated circuit (PMIC) of the communication module 1000. In addition, the connector 1020 may transmit a signal received from the outside to the RF chip 1030, and may output a signal provided from the RF chip 1030 to the outside.

Each of the antenna arrays 1040_1 and 1040_2 may extend parallel to the X-axis, and may be arranged adjacent to an edge of the RF chip 1030 extending parallel to the X-axis. That is, as shown in FIG. 14, the antenna arrays 1040_1 and 1040_2 may be arranged adjacent to edges of the RF chip 1030 that are opposite to each other in the Y-axis direction. The arrangement of the RF chip 1030 and the antenna arrays 1040_1 and 1040_2 shown in FIG. 14 is only an example, and may be modified according to various example embodiments.

The discrete devices 1050 may include at least one passive device having a relatively large value and/or a relatively high withstand voltage. For example, the discrete devices 1050 may include bypass (or decoupling) capacitors for a stable supply voltage.

The clock integrated circuit 1060 may apply example embodiments, and may provide a first clock signal generated by a crystal oscillator and a second clock signal generated by an RC oscillator to the RF chip 1030. As described above, the clock integrated circuit 1060 may perform a calibration operation on the second clock signal by using the first clock signal, and may consider the temperature of the clock integrated circuit 1060 in a calibration operation. Furthermore, the communication module 1000 may further include a baseband processor, and the clock integrated circuit 1060 may also provide the first clock signal and the second clock signal to the baseband processor.

Figure 15:
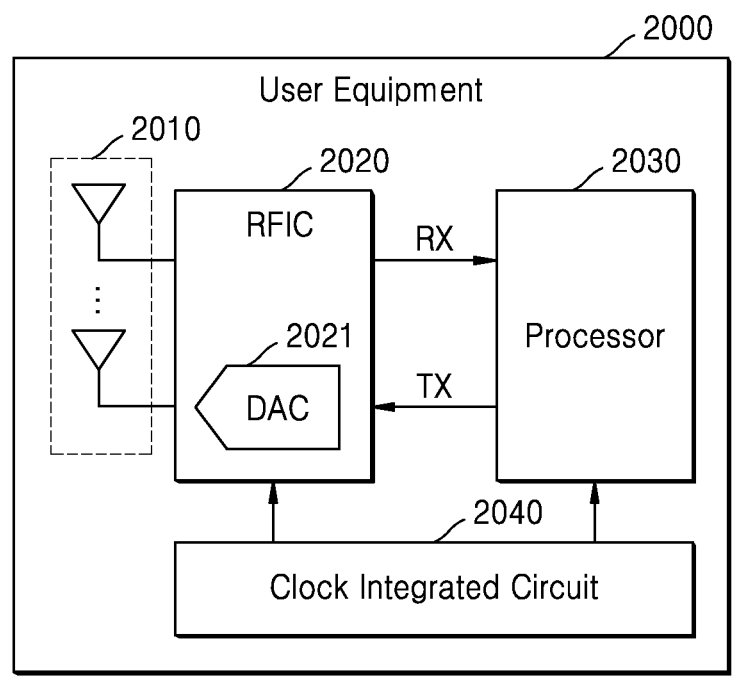
FIG. 15 is a block diagram of a user device according to an example embodiment.

FIG. 15 is a block diagram of a user device 2000 according to an example embodiment.

Referring to FIG. 15, the user device 2000 may include an antenna array 2010, a radio frequency integrated circuit (RFIC) 2020, a processor 2030, and a clock integrated circuit 2040.

The antenna array 2010 may include at least one antenna, and may receive or transmit an RF signal from or to a base station or other user equipment. In some example embodiments, the antenna array 2010 may include a plurality of antennas for multi-input multi-output (MIMO).

The RFIC 2020 is hardware coupled to the antenna array 2010 and the processor 2030 and may provide an RF path for wireless communication. For example, the RFIC 2020 may be referred to as a transceiver. The RFIC 2020 may provide a receive signal RX as a baseband signal to the processor 2030 by processing an RF signal received from the antenna array 2010, and may provide an RF signal to the antenna array 2010 by processing a transmit signal TX as a baseband signal. The RFIC 2020 may be controlled by the processor 2030, and may include, by way of non-limiting examples, switches, matching circuits, filters, amplifiers, mixers, analog to digital converters (ADCs), or digital to analog converters (DACs) 2021. The processor 2030 may communicate with the RFIC 2020 through baseband signals, that is, the receive signal RX and the transmit signal TX.

The clock integrated circuit 2040 may apply example embodiments, and may provide a first clock signal and a second clock signal to the RFIC 2020 and the processor 2030, respectively. As described above, the clock integrated circuit 2040 may perform a calibration operation of adjusting a division ratio with respect to the second clock signal by using the first clock signal generated by the crystal oscillator, and in the calibration operation, the clock integrated circuit 2040 may additionally consider temperature.

Figure 16:
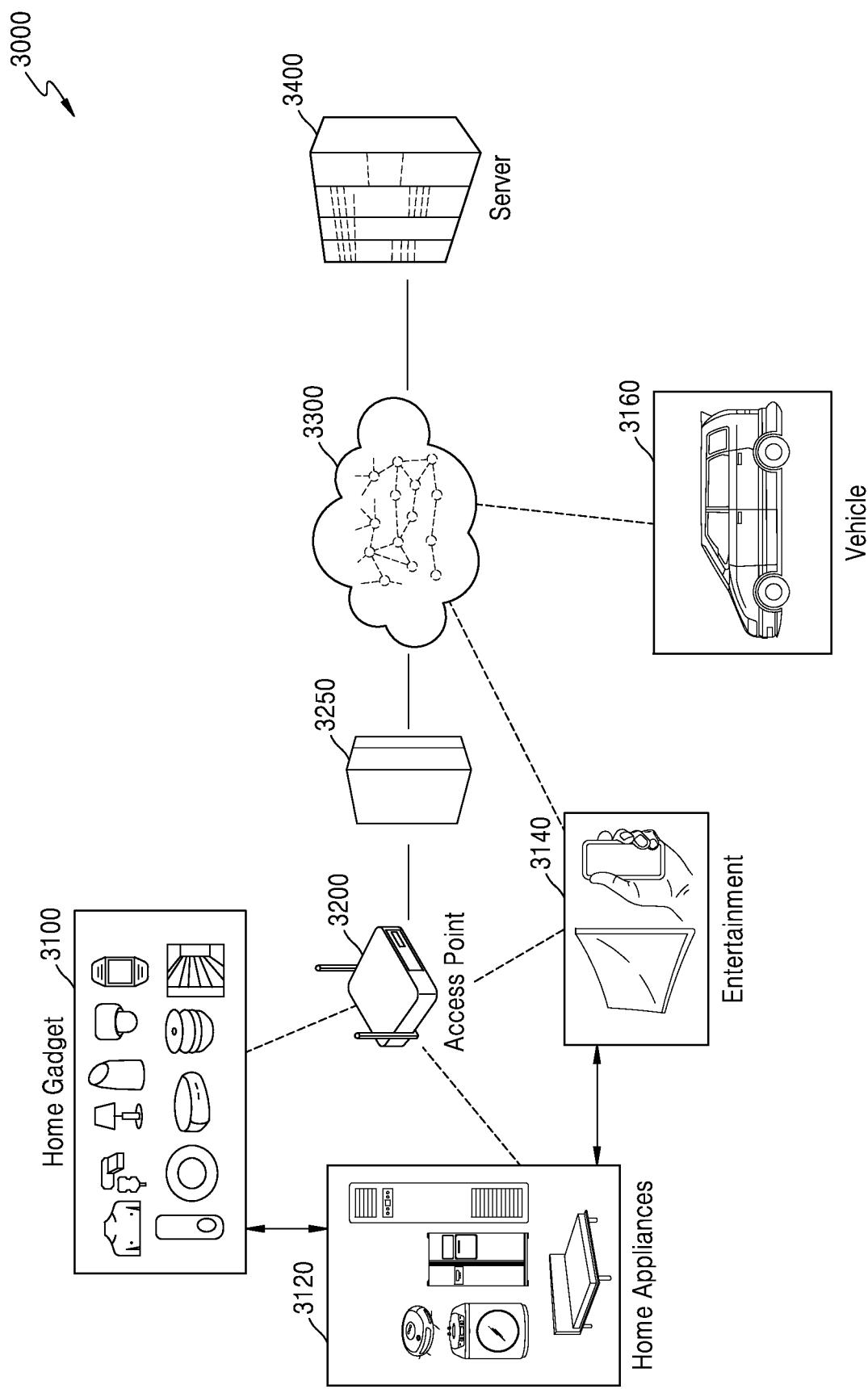
FIG. 16 is a conceptual diagram illustrating an Internet of Things (IoT) network according to example embodiments.

FIG. 16 is a conceptual diagram illustrating an Internet of Things (IoT) network system 3000 according to example embodiments.

Referring to FIG. 16, the IoT network system 3000 may include a plurality of IoT devices 3100, 3120, 3140, and 3160, an access point 3200, a gateway 3250, a wireless network 3300, and a server 3400. IoT may refer to a network between things using wired/wireless communication.

Each of the IoT devices 3100, 3120, 3140, and 3160 may form a group according to characteristics of each IoT device. For example, IoT devices may be grouped into a home gadget group (i.e., the IoT device 3100), a home appliance/furniture group (i.e., the IoT device 3120), an entertainment group (i.e., the IoT device 3140), or a vehicle group (i.e., the IoT device 3160). The plurality of IoT devices 3100, 3120, 3140, and 3160 may be connected to a communication network through the access point 3200 or connected to other IoT devices. The access point 3200 may be embedded in one IoT device. The gateway 3250 may change a protocol to connect the access point 3200 to an external wireless network. The IoT devices 3100, 3120, 3140, and 3160 may be connected to an external communication network through the gateway 3250. The wireless network 3300 may include the Internet and/or a public network. The plurality of IoT devices 3100, 3120, 3140, and 3160 may be connected to the server 3400, which provides a certain service, through the wireless network 3300, and a user may use a service through at least one of the plurality of IoT devices 3100, 3120, 3140, and 3160. Each of the plurality of IoT devices 3100, 3120, 3140, and 3160 may include a clock integrated circuit according to example embodiments.

At least one of the components, elements, modules or units represented by a block as illustrated in FIGS. 1, 2A, 2B, 6, 11, 14 and 15 may be embodied as various numbers of hardware, software and/or firmware structures that execute respective functions described above, according to an example embodiment. For example, at least one of these components, elements, modules or units may include circuitry such as transistors, capacitors, logic gates, and other circuit elements to implement certain functionality described in more detail above. For example, at least one of these components, elements, modules or units may use a direct circuit structure, such as a memory, a processor, a logic circuit, a look-up table, etc., that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:

1. A clock integrated circuit comprising:
   a first clock generator which comprises a crystal oscillator and is configured to use the crystal oscillator to generate a first clock signal; and
   a second clock generator which comprises a resistance-capacitance (RC) oscillator and a first frequency divider, and is configured to:
      generate a second clock signal using the first frequency divider based on a clock signal output from the RC oscillator;
      perform a first calibration operation for adjusting a frequency division ratio of the first frequency divider to a first frequency division ratio based on the first clock signal; and
      perform a second calibration operation for adjusting the first frequency division ratio to a second frequency division ratio based on a sensed temperature.

2. The clock integrated circuit of claim 1, wherein the first clock signal belongs to a first frequency band and corresponds to a main clock signal for at least one of a data processing operation and a data communication operation,
   wherein the second clock signal belongs to a second frequency band and corresponds to a real time clock signal for at least one of a time measurement and a system on/off operation, and
   wherein the first frequency band is higher than the second frequency band.

3. The clock integrated circuit of claim 1, wherein the second clock generator is further configured to calculate, in the first calibration operation, the first frequency division ratio based on a first counting result with respect to the first clock signal and a second counting result with respect to the clock signal output from the RC oscillator.

4. The clock integrated circuit of claim 3, wherein the second clock generator is further configured to calculate, in the first calibration operation, the first frequency division ratio by multiplying a first value by a second value,
   wherein the first value is obtained by dividing a frequency of the first clock signal by a target frequency of the second clock signal, and
   wherein the second value is obtained by dividing the second counting result by the first counting result.

5. The clock integrated circuit of claim 1, wherein the second calibration operation further comprises an operation of adjusting a temperature compensation gain based on the sensed temperature, and
   wherein the second clock generator is further configured to selectively perform the first calibration operation and the operation of adjusting the temperature compensation gain, based on whether a calibration condition is satisfied.

6. The clock integrated circuit of claim 1, wherein the second clock generator is further configured to, in the second calibration operation:
   calculate a temperature compensation gain based on a difference between the first frequency division ratio and a reference frequency division ratio, and a difference between the sensed temperature and a reference temperature; and
   adjust the first frequency division ratio to the second frequency division ratio based on the temperature compensation gain.

7. The clock integrated circuit of claim 6, wherein the second clock generator is further configured to, in the second calibration operation:
   update the reference frequency division ratio to the first frequency division ratio; and
   update the reference temperature to the sensed temperature after calculating the temperature compensation gain.

8. The clock integrated circuit of claim 6, further comprising a plurality of adjustment paths which correspond to a plurality of temperature ranges, respectively, and
   wherein the second clock generator is further configured to, in the second calibration operation:
      adjust the temperature compensation gain through an adjustment path, from among the plurality of adjustment paths, corresponding to a range to which the sensed temperature belongs; and
      adjust the first frequency division ratio to the second frequency division ratio based on the adjusted temperature compensation gain.

9. The clock integrated circuit of claim 8, wherein the plurality of adjustment paths comprise infinite impulse response (IIR) filters having different output gains, respectively.

10. The clock integrated circuit of claim 1, wherein the second clock generator is further configured to:
    perform the first calibration operation and the second calibration operation when the clock integrated circuit is in an active mode or a calibration mode; and
    adjust a temperature compensation gain in the second calibration operation.

11. The clock integrated circuit of claim 10, wherein the second clock generator is further configured to, when the clock integrated circuit is in an off mode, perform the second calibration operation based on the first frequency division ratio and the temperature compensation gain finally adjusted in the active mode or the calibration mode just before being switched to the off mode.

12. The clock integrated circuit of claim 1, wherein the first clock generator is further configured to operate according to an operation mode of the clock integrated circuit.

13. The clock integrated circuit of claim 12, wherein the first clock generator is further configured to, when the operation mode is a calibration mode, generate the first clock signal in a portion of a period in which the first calibration operation and the second calibration operation are performed, and cease generation of the first clock signal in a remaining period.

14. An apparatus comprising:
a first clock generator configured to generate a first clock signal having a first frequency using a first oscillator; and
a second clock generator configured to:
generate a second clock signal having a second frequency by dividing a clock signal output from a second oscillator;
generate an enable signal based on whether a calibration condition is satisfied; and
control the second frequency to a target frequency by controlling a frequency division ratio of the second clock generator based on the first clock signal and a sensed temperature,
wherein the first clock generator is further configured to provide the first clock signal to the second clock generator according to the enable signal.

15. The apparatus of claim 14, wherein the first oscillator comprises a crystal oscillator, and
wherein the second oscillator comprises a resistance-capacitance (RC) oscillator.

16. The apparatus of claim 14, wherein the second clock generator is further configured to control:
the frequency division ratio by performing a first calibration operation of controlling the frequency division ratio based on the first clock signal and a second calibration operation of controlling the frequency division ratio based on the sensed temperature;
selectively perform the first calibration operation based on at least one of an operation mode and a calibration condition; and
selectively adjust a temperature compensation gain used in the second calibration operation, based on at least one of the operation mode and the calibration condition.

17. The apparatus of claim 14, wherein the second clock generator is further configured to:
determine a temperature compensation gain based on a difference between the sensed temperature and a reference temperature;
determine a first frequency division ratio based on the target frequency, and a ratio between the first frequency and the second frequency;
determine a second frequency division ratio by applying the temperature compensation gain to the first frequency division ratio; and
control the frequency division ratio to the second frequency division ratio.

18. The apparatus of claim 17, wherein the second clock generator is further configured to determine the temperature compensation gain based on a range to which the sensed temperature belongs, from among a plurality of temperature ranges.

19. The apparatus of claim 14, further comprising:
at least one communication integrated circuit configured to operate based on the first clock signal; and
at least one processor configured to operate based on the first clock signal,
wherein the second clock signal corresponds to a real-time clock signal for at least one of a time measurement of the at least one processor and a system on/off operation.

20. A clock integrated circuit comprising:
a crystal oscillator;
a gain control circuit configured to output a clock signal generated by the crystal oscillator as a first clock signal;
a resistance-capacitance (RC) oscillator;
a frequency division circuit configured to divide a clock signal generated by the RC oscillator and output the divided clock signal as a second clock signal; and
a calibration circuit configured to control the second clock signal to have a target frequency by adjusting a frequency division ratio of the frequency division circuit based on the first clock signal,
wherein the first clock signal is output to an electronic circuit as a main clock signal of a first frequency band, and
wherein the second clock signal is output to the electronic circuit as a real-time clock signal of a second frequency band that is lower than the first frequency band.

* * * * *